(12) United States Patent
Nishikawa et al.

(10) Patent No.: US 7,060,528 B2
(45) Date of Patent: Jun. 13, 2006

(54) METHOD FOR MOUNTING A SEMICONDUCTOR ELEMENT TO AN INTERPOSER BY COMPRESSION BONDING

(75) Inventors: Hidenobu Nishikawa, Ikoma (JP); Kazuto Nishida, Katano (JP); Kazumichi Shimizu, Toyonaka (JP); Hiroyuki Otani, Ikoma (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 228 days.

(21) Appl. No.: 10/253,604

(22) Filed: Sep. 25, 2002

(65) Prior Publication Data

US 2003/0166313 A1   Sep. 4, 2003

(30) Foreign Application Priority Data

Sep. 26, 2001   (JP) ............................. 2001-293686

(51) Int. Cl.
   *H01L 21/48*   (2006.01)
(52) U.S. Cl. .................... 438/110; 438/113; 438/118; 438/458; 438/462
(58) Field of Classification Search ........ 438/106–109, 438/118, 612, 613, 617; 257/738, 778, 779, 257/780, 782, 783, 785
   See application file for complete search history.

(56) References Cited

U.S. PATENT DOCUMENTS

| | | | |
|---|---|---|---|
| 6,075,280 A * | 6/2000 | Yung et al. ................ | 257/620 |
| 6,338,980 B1 * | 1/2002 | Satoh ........................ | 438/106 |
| 6,376,278 B1 * | 4/2002 | Egawa et al. ............... | 438/110 |
| 6,420,213 B1 * | 7/2002 | Nakajyo et al. ............ | 438/118 |
| 6,561,408 B1 * | 5/2003 | Hosotani et al. ........... | 228/44.7 |
| 6,797,544 B1 * | 9/2004 | Sakai et al. ................. | 438/121 |

FOREIGN PATENT DOCUMENTS

| | | | |
|---|---|---|---|
| JP | 01287936 A | * | 11/1989 |
| JP | WO9830073 | * | 7/1998 |
| JP | 10256306 A | * | 9/1998 |

OTHER PUBLICATIONS

K. Nishida et al., "*New Flip-Chip Bonding Technology NSD Method Using Resin Encapsulation Sheet*", Proceedings 2000, International Symposium on Microelectronics (International Microelectronics and Packaging Society) issued Sep. 20, 2000, (Matsushita Electric Ind. Co., Ltd.).

* cited by examiner

*Primary Examiner*—Alonzo Chambliss
(74) *Attorney, Agent, or Firm*—Wenderoth, Lind & Ponack, L.L.P.

(57) ABSTRACT

A semiconductor element mounting method is provided with high productivity. The method includes forming bumps on electrodes of a wafer in which a plurality of semiconductor elements have been formed, temporarily compression-bonding the wafer and an interposer via an insulative resin, curing the resin by performing heating and pressurization so that the wafer and the interposer are finally compression-bonded, wherein the electrodes of the wafer and electrodes of the interposer are bonded to each other, respectively, and wherein insulative resin overflowing from between the wafer and the interposer flows into grooves disposed so as to be coincident with dicing lines of the wafer, thus providing a uniform flow of the insulative resin, and thereafter, cutting and separating this bonded unit into individual semiconductor elements.

16 Claims, 20 Drawing Sheets

METHOD FOR MOUNTING A SEMICONDUCTOR ELEMENT TO AN INTERPOSER BY COMPRESSION BONDING

BACKGROUND OF THE PRESENT INVENTION

The present invention relates to a semiconductor element mounting method for mounting a wafer itself, or semiconductor elements separated from the wafer, onto an interposer which is to be mounted onto a circuit board.

Today, electronic circuit boards have been put into use in every kind of product, and in view of increases in portable equipment, there is a demand for flip-chip mounting methods for mounting circuit-board IC chips as they are naked, other than packaged.

Here is described below a prior-art method for bonding IC chips to a circuit board of electronic equipment.

As shown in FIGS. 20A to 22, a semiconductor element mounting process in which an insulative resin sheet is used as a sealing material for a semiconductor element mounting method has been proposed.

Referring to FIG. 20A, a wafer 101 is sucked onto an equipment first stage 108, planarized and heated to 250° C. from the first stage 108. Thereafter, referring to FIG. 20B, stud bumps 103 are formed from a 25 μm diameter Au wire (made by Mitsubishi Materials Corp.) via a capillary 104 attached to a wire bonding apparatus. Otherwise, bumps may be formed by plating on pads of the wafer 101.

Referring to FIG. 20C, on an interposer 105, an insulative resin sheet 106 containing electrically conductive particles is set in a semiconductor element mounting region. Referring to FIG. 21A, the insulative resin sheet 106 is attached to the interposer 105 by performing heating and pressurization with an attaching tool 107 containing a cartridge heater 108. The heating in this case requires such a temperature that the insulative resin sheet 106 reacts so as to not be cured but softened, thus becoming easier to attach to the interposer 105, where a temperature is normally 60 to 100° C.

Referring to FIGS. 21B and 21C, a film called separator on the insulative resin sheet 106 is separated therefrom, and electrodes on the interposer 105 and the bumps 103 on the wafer are aligned so as to contact each other, respectively. Then, the insulative resin sheet 106 is subjected to a curing reaction through heating and loading with a compression-bonding tool 110 containing a cartridge heater 108a, and thereby compression-bonded. This compression-bonding is performed normally under conditions of 180 to 240° C. and 8 to 30 sec.

Referring to FIG. 22, the wafer 101 compression-bonded to the interposer 105 is divided into chips on a basis of each semiconductor device 126 by using a dicing unit.

For mounting of each semiconductor element chip, normally, an anisotropic conductive film (ACF) formed by mixing conductive particles into an insulative resin sheet has widely been put into practical use as an ACF technique.

Further, it has become achievable to manufacture a semiconductor device simultaneously and easily in short time by performing the foregoing steps.

As shown above, flip chip mounting as shown in the prior art has been proposed and practically used in order to implement downsizing of electrical appliances. However, the flip chip mounting has encountered the following issues.

First, since semiconductor elements are mounted by performing compression-bonding and performing heating and pressurization, chip to chip, productivity is not improved. Therefore, a process has been proposed at a wafer level for improvement of productivity. The process includes steps of forming bumps on electrodes of a wafer, setting an ACF between the wafer and an interposer in contact therewith, curing the ACF by performing heating and pressurization to thereby compression-bond the wafer and the interposer so that electrodes of the wafer and electrodes of the interposer are bonded with each other, and thereafter separating semiconductor elements from one another. However, ACF or other pressure-bonding techniques, like the prior art one, would involve larger amounts of escape of resin of the ACF to peripheral portions of the wafer, while the resin of the ACF could not escape in central portions, thereby making it difficult to achieve uniform bonding at the wafer level.

Second, as formation of stud bumps at a wafer level involves heating a wafer, there would be a large difference in heat history between bump formation for a first semiconductor element and bump formation for a last semiconductor element. In particular, bump formation for earlier numbers of order of a bump formation sequence would require a longer heating time, which would promote formation of alloy layers between this semiconductor element and Au bumps. This would result in lowered bonding strengths of bumps on electrodes of semiconductor elements.

Third, during stud bump formation on a semiconductor element, there is a possibility that electrodes of semiconductor elements, such as Al, would be exposed, which might in turn cause corrosion of these semiconductor-element electrodes due to moisture absorption after assembling of a semiconductor device.

Fourth, at present, since marking of a first pin or the like is applied to one surface of a semiconductor element opposite to its semiconductor-element surface for each chip of semiconductor devices, productivity is not improved.

Fifth, during marking at a wafer level, there is a difficulty in recognizing a positional relationship between a semiconductor-element surface and a semiconductor-element opposing surface. In this regard, though a through hole may be provided in semiconductor elements during etching or another process to show a front-and-rear surface positional relationship, this would cause an increase in cost.

Sixth, in the ACF process, which includes attaching an ACF to an interposer and thereafter mounting semiconductor elements, supply of insulative sealing resin for semiconductor elements is performed on a basis of each semiconductor element chip, which would result in lower productivity. Moreover, attaching the ACF arbitrarily to a specified place of the interposer poses a complexity for mass-production equipment. Furthermore, in a case where a plurality of semiconductor elements are mounted on one interposer, a plurality of sizes of ACFs need to be prepared in terms of process, which would lead to an increase in cost as well as a complexity in mass-production control.

Seventh, in a case of a semiconductor device made up by stacking a plurality of semiconductor elements, using as a stacking technique an ACF or other pressure-bonding technique involving pressurization and heating would cause a lower-side wafer to be bent during the pressurization, which would result in insufficient electrical bonding between a lower-layer wafer and an upper-layer wafer.

Eighth, in a case of a semiconductor device made up by stacking a plurality of semiconductor elements, cutting a wafer into chips after wafer stacking might incur defects or cracks of the semiconductor elements due to orientation differences in semiconductor crystal planes between upper and lower layers.

Among various issues as described above, in particular, the greatest issue is that productivity improvement cannot be achieved because of a process by which semiconductor elements are compression-bonded and subjected to heat and pressurization on a chip basis for element mounting.

Accordingly, an object of the present invention is to provide a semiconductor element mounting method capable of high productivity.

SUMMARY OF THE PRESENT INVENTION

In order to achieve the above object, the present invention has the following constitution.

According to a first aspect of the present invention, there is provided a method for mounting semiconductor elements, comprising:

forming stud bumps, via wire bonding, on electrodes of a wafer in which a plurality of semiconductor elements have been formed;

temporarily compression-bonding the plurality of semiconductor elements of the wafer and an interposer so that the semiconductor elements and the interposer are brought into contact with an insulative resin layer positioned therebetween;

curing the insulative resin by heating at a temperature higher than that of the temporary compression-bonding and by pressing at a pressure greater than that of the temporary compression-bonding to finally compression-bond the wafer and the interposer to each other so that individual electrodes of the plurality of semiconductor elements on the wafer and individual electrodes of the interposer are bonded to each other, respectively, by which a bonded unit is formed; and thereafter, cutting and separating the bonded unit by dicing into units of each of semiconductor elements of the wafer, by which chips of semiconductor devices are manufactured.

According to a second aspect of the present invention, there is provided the semiconductor element mounting method according to the first aspect, wherein during the final compression-bonding, the insulative resin overflowing from between the wafer and the interposer flows into grooves disposed so as to be coincident with dicing lines of the wafer, thus providing a uniform flow of the insulative resin.

According to a third aspect of the present invention, there is provided the semiconductor element mounting method according to the first aspect, wherein during the final compression-bonding, the insulative resin overflowing from between the wafer and the interposer flows into grooves which are disposed so as to be coincident with dicing lines of the wafer, with each of the grooves having a volume V1 ($cm^3$/mm) equal to or greater than an insulative-resin overflow volume V2 ($cm^3$/mm) per unit length in peripheral portions of the wafer resulting after the final compression-bonding of the interposer and the wafer, thus providing a uniform flow of the insulative resin.

According to a fourth aspect of the present invention, there is provided the semiconductor element mounting method according to any one of the first through third aspects, wherein during stud bump formation, heating is performed on each semiconductor element formation region on the wafer.

According to a fifth aspect of the present invention, there is provided the semiconductor element mounting method according to any one of the first through third aspects, wherein during the final compression-bonding, heating is performed on each semiconductor element formation region on the wafer.

According to a sixth aspect of the present invention, there is provided the semiconductor element mounting method according to any one of the first through fifth aspects, further comprising, after formation of the stud bumps on the electrodes of the wafer, forming the insulative resin layer on the wafer.

According to a seventh aspect of the present invention, there is provided the semiconductor element mounting method according to the sixth aspect, further comprising: after formation of the stud bumps on the electrodes of the wafer, forming an insulating resin paste in a spin coating manner and curing the paste to thereby form an insulative resin layer on the wafer.

According to an eighth aspect of the present invention, there is provided the semiconductor element mounting method according to the sixth aspect, further comprising: after formation of the stud bumps on the electrodes of the wafer, forming an insulating resin paste in a spin coating manner and semi-curing the paste to thereby form an insulative resin layer on the wafer.

According to a ninth aspect of the present invention, there is provided the semiconductor element mounting method according to the sixth aspect, further comprising: after formation of the stud bumps on the electrodes of the wafer, attaching an insulating resin film onto the wafer and thereafter heating and pressing the insulative resin film to thereby form an insulative resin layer on the wafer.

According to a tenth aspect of the present invention, there is provided the semiconductor element mounting method according to any one of the first through ninth aspects, wherein before bump formation, simultaneous marking on each semiconductor element is performed in advance on one surface of the wafer opposite to its semiconductor element formation surface.

According to an eleventh aspect of the present invention, there is provided the semiconductor element mounting method according to the tenth aspect, wherein during the in-advance semiconductor-element-basis simultaneous marking on the surface of the wafer opposite to its semiconductor element formation surface, positional alignment is performed by using as a stopper reference an orientation flat provided on the wafer.

According to a twelfth aspect of the present invention, there is provided the semiconductor element mounting method according to the fifth aspect, wherein for heating during stud bump formation, a surface of a semiconductor element formation region opposite to a stud-bump formation surface, with the semiconductor element formation region being a region where the stud bumps are to be formed, is sucked and held, and heated, by a second stage other than a first stage for sucking and holding the wafer.

According to a thirteenth aspect of the present invention, there is provided the semiconductor element mounting method according to the 14th aspect, wherein for heating during stud bump formation, the second stage moves in synchronization with movement of the semiconductor element formation region where the stud bumps are to be formed, so as to normally suck and hold, and heat, the surface of the semiconductor element formation region opposite to the stud-bump formation surface where the stud bumps are to be formed.

According to a fourteenth aspect of the present invention, there is provided the semiconductor element mounting method according to the first aspect, further comprising: after formation of the bonded unit, compression-bonding another wafer onto the wafer of the bonded unit via a second insulative resin in a stacking manner; aligning positions of bumps of up-and-down stacked wafers with positions of bumps of another wafer; bonding electrodes of the up-anddown stacked wafers through the second insulative resin; and cutting and separating this bonded unit into individual semiconductor elements of the wafers by dicing, by which chips of the semiconductor devices are manufactured.

According to a fifteenth aspect of the present invention, there is provided the semiconductor element mounting method according to the fourteenth aspect, wherein the up-and-down stacked wafers are stacked on each other with crystal structure planes of two wafers being aligned with each other.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
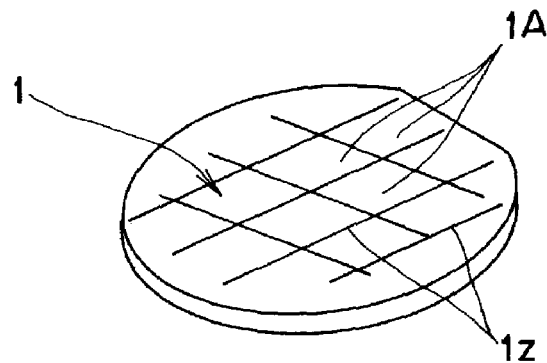
FIGS. 1A, 1B, and 1C are explanatory views, respectively, showing a semiconductor element mounting method according to a first embodiment of the present invention.

Before description of the present invention proceeds, it is to be noted that like parts are designated by like reference numerals throughout the accompanying drawings.

Hereinbelow, embodiments of the present invention are described in detail with reference to the accompanying drawings.

First Embodiment

Figure 1B:
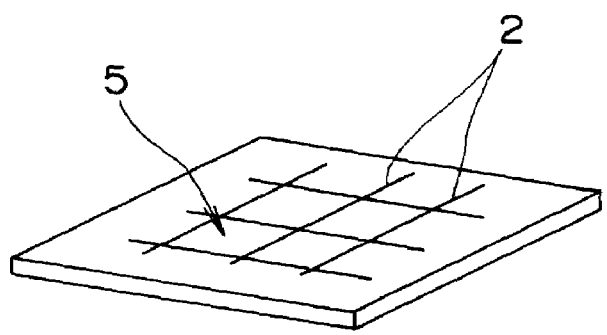
Figure 1C:
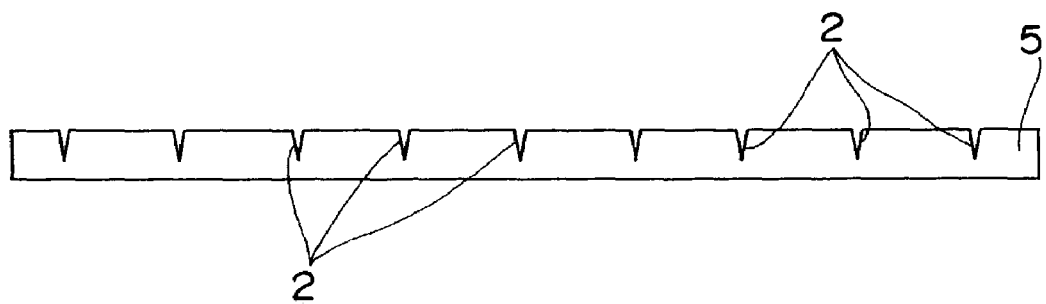

A semiconductor element mounting method according to a first embodiment of the present invention, as shown in FIGS. 1A–1C, includes: a bump formation step for forming bumps 3 on electrodes, respectively, of a wafer 1 in which a multiplicity of semiconductor elements 1A have been formed; a temporary compression-bonding step for thereafter temporarily compression-bonding the wafer 1 to an intermediate circuit board for semiconductor device formation, i.e. interposer 5, in such a manner that the wafer 1 comes into contact with an insulative resin layer (in the first embodiment, an insulative resin sheet as an example) 6 provided between the wafer 1 and the interposer 5; a final compression-bonding step for thereafter curing thermosetting or thermoplastic insulative resin of the insulative resin layer 6 by performing heating and pressurization to finally compression-bond the wafer 1 and the interposer 5 together so that the electrodes on the wafer 1 and electrodes on the interposer 5 are bonded together to form a bonded unit 30; and a separation step for thereafter separating the bonded unit 30 into units each of a semiconductor device containing a semiconductor element 1A, thus manufacturing a semiconductor device 26. This manufactured semiconductor device 26 is mounted singly or together with other electronic components onto a circuit board in which specified circuits are formed. It is noted that solid lines 1z in FIG. 1A are imaginary lines showing boundaries between individual semiconductor elements.

More specifically, during the bump formation step, the wafer 1 is sucked onto a wafer-holding stage and then planarized, and heated to, for example, 250° C. from the stage. Thereafter, stud bumps 3 are formed on pad electrodes, respectively, of the wafer 1 with use of, for example, a 25 μm diameter Au wire (made by Mitsubishi Materials Corp.) via a capillary attached to a wire bonding apparatus. During formation of the stud bumps 3 onto the electrodes of the wafer 1 with the Au wire, heating of the wafer 1 is performed in units of each semiconductor element formation region on the wafer 1. Instead of this, plating may be applied onto each pad of the wafer 1 to form bumps.

During the temporary compression-bonding step, after formation of the stud bumps 3 on the electrodes of the wafer 1 from the Au wire, insulative resin paste is supplied to an entire surface of the wafer 1 and then spread in a spin coating manner, thereby forming the insulative resin layer 6. Thereafter, the insulative resin layer 6 is cured or semi-cured. Otherwise, formation of the insulative resin layer 6 onto the wafer 1 may be performed through steps of attaching an insulative resin film onto the entire surface of the wafer 1, thereafter performing heating and pressurization to form the insulative resin layer 6, and curing or semi-curing the insulative resin layer 6. In a case where the insulative resin layer 6 is composed of a thermosetting insulative resin, the insulative resin layer 6 is uncured or semi-cured. The insulative resin layer 6 on the wafer 1 may be either completely cured or semi-cured, wherein complete curing enhances protection of electrode exposure portions of the semiconductor elements 1A, while semi-curing enhances adhesion to the insulative sealing resin in a later semiconductor-element mounting process, so that the semiconductor device itself can be improved in terms of reliability grade.

On the other hand, independently of this, V-shaped grooves 2 having a depth of, for example, 0.15 mm are formed in the interposer 5 so as to be parallel to one another and in a lattice form so as to be coincident with dicing lines, on a basis of the semiconductor element 1A by using a dicing unit. These grooves 2 are provided beforehand at peripheral portions of the individual semiconductor elements 1A on a top surface of the wafer 1 or at peripheral portions on the interposer 5 side where semiconductor elements 1A are to be compression-bonded. As an example, FIGS. 1B and 1C show a state in which the grooves 2 are provided beforehand at peripheral portions on the interposer 5 side where the semiconductor elements 1A are to be compression-bonded. Also, a volume V1 (cm³/mm) of the grooves 2 provided at outer peripheries of the individual semiconductor elements 1A on the wafer 1 or at the peripheral portions on the interposer 5 side where the semiconductor elements 1A are to be compression-bonded, and an insulative-resin overflow volume V2 (cm³/mm) of the insulative resin layer 6 per unit length around the wafer 1 resulting after compression-bonding of the interposer 5 and the wafer 1 together, are so set as to satisfy a condition that V2<V1.

Figure 2A:
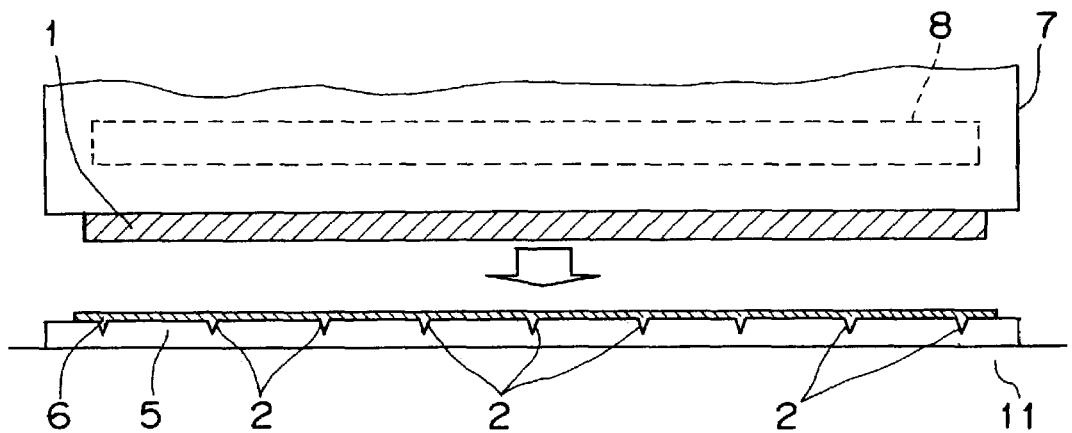
FIGS. 2A and 2B are explanatory views, respectively, showing the semiconductor element mounting method according to the first embodiment of the present invention, subsequent to FIGS. 1A–1C.

After making of grooves 2 of such a volume, during the temporary compression-bonding step, as shown in FIG. 2A, the wafer 1 and the interposer 5 are temporarily compression-bonded together by slightly curing the insulative resin of the insulative resin layer 6 through a heating of, for example, 80° C. and a pressurization of, for example, about 14.7 MPa (150 kgf/cm²) with an attaching tool 7 containing a cartridge heater 8. When the wafer 1 is pressed by the attaching tool 7 and thereby attached to the interposer 5 in this way, sufficient escaping space for the insulative resin of the insulative resin layer 6 can be ensured by the grooves 2, thus enabling uniform pressure bonding to the interposer 5 within the wafer 1. Preferably, the wafer 1 is held by suction to the attaching tool 7, while the interposer 5 is positioned and held by suction on a stage 11.

In addition, the attaching tool 7 containing the cartridge heater 8 may be used as a temporary-compression-bonding mounting head, or attaching tool for use of temporary compression-bonding or attaching of resin sheets or the like also in other embodiments.

Figure 2B:
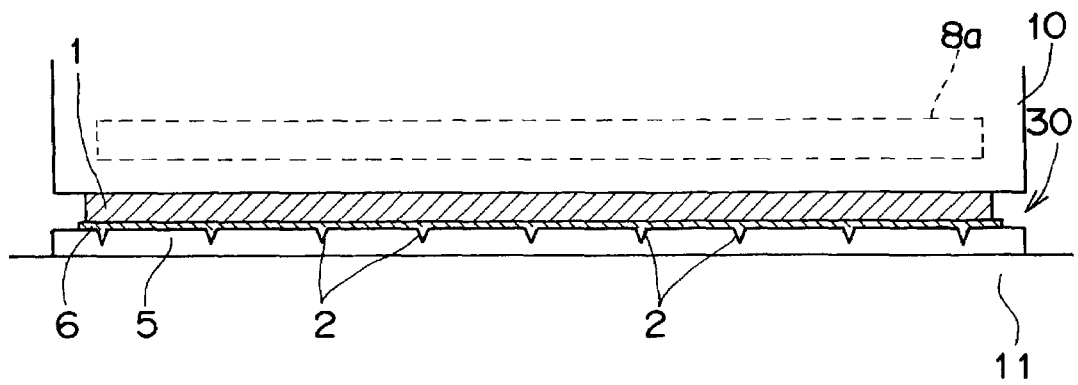

In the subsequent final compression-bonding step, as shown in FIG. 2B, with the wafer 1 temporarily compression-bonded to the interposer 5 on the stage 11 via the insulative resin layer 6, a rear surface (upper surface in the figure) of the wafer 1 is pressed with a final compression-bonding load of, for example, about 44.1 MPa (450 kgf/cm²) by a compression-bonding tool 10 containing a cartridge heater 8a, and heated to, for example, 200° C., so that the insulative resin of the insulative resin layer 6 is completely cured, by which the wafer 1 and the interposer 5 are finally compression-bonded. After this final compression-bonding, the bumps 3 on the wafer 1 and the electrodes on the interposer 5 are in direct contact and electrical connection with each other, respectively, while passing through the insulative resin layer 6.

In addition, the compression-bonding tool 10 containing the cartridge heater 8a may be used as a final-compression-bonding mounting head for use of final compression-bonding also in other embodiments.

Figure 3A:
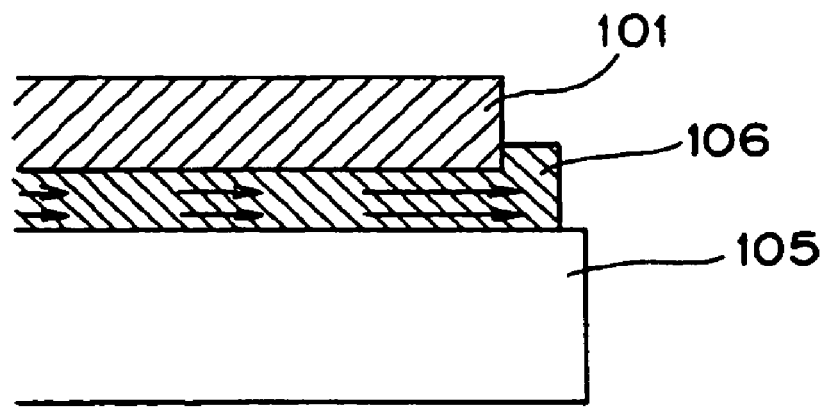
FIGS. 3A and 3B are an explanatory view showing a semiconductor element mounting method according to the prior art and an explanatory view showing the semiconductor element mounting method according to the first embodiment of the present invention, subsequent to FIGS. 1A–1C, respectively.
Figure 3B:
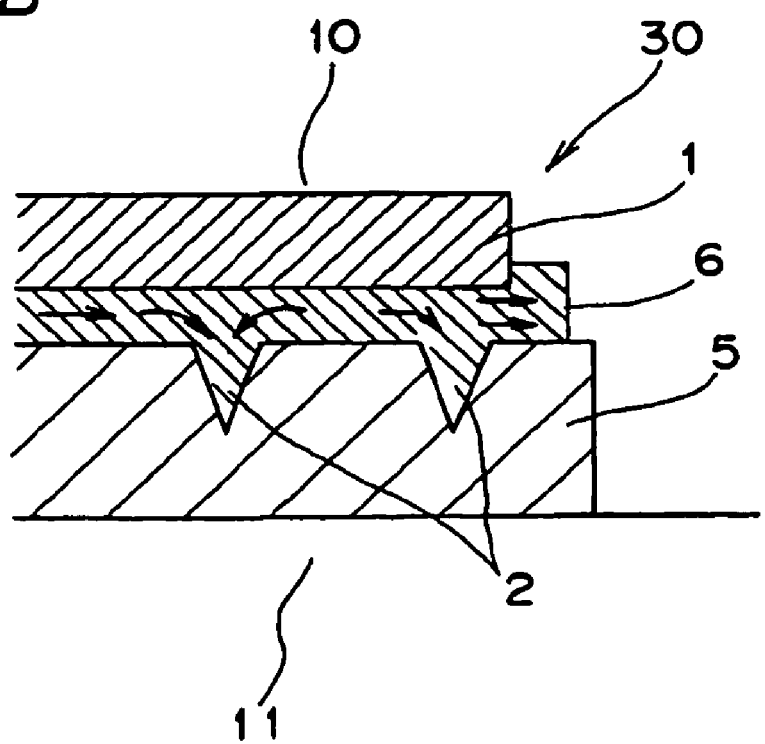

In this connection, under a condition that the grooves 2 are not provided in the interposer 105 as in the prior art, a flow of the insulative resin 106 during final compression-bonding is shown in FIG. 3A. Insulative resin of a central portion of wafer 101 does not flow out, while insulative resin of its peripheral portions flows with higher mobility. As a result, bumps 103 of the central portion of the wafer 101 show higher values of connection resistance with electrodes of the interposer 105 than those of the peripheral portions of the wafer 101, or show openness of connection. On the other hand, in FIG. 3B, which corresponds to this first embodiment, in a central portion and peripheral portions of the wafer 1, flow of the insulative resin of the insulative resin layer 6 in the central portion and the peripheral portions of the wafer 1 becomes uniform by virtue of presence of the grooves 2 provided in the interposer 5, so that a stable electrical connection can be obtained at the central portion and peripheral portions of the wafer 1.

In a subsequent separation step, for a semiconductor device including the semiconductor element 1A, the bonded unit 30 is separated and chips are cut out in units of the semiconductor element 1A, by which a multiplicity of semiconductor devices are obtained.

According to the above-described first embodiment, since the bumps 3 of the plurality of semiconductor elements 1A can be compression-bonded to the electrodes of the interposer 5 in a simultaneous manner, it is no longer necessary to give consideration to thickness variations among individual chips of the semiconductor elements 1A, whereas it is necessary to give consideration to thickness of every chip of the semiconductor elements 1A when the semiconductor elements 1A are mounted to the interposer on a chip basis. Also, since the plurality of semiconductor elements 1A are attached (stuck) to the interposer 5 via the resin layer 6, need for a resist application step, curing step, exposure step, development step, plating step or the like is eliminated. In other words, plating or other process steps that can be performed only in semiconductor factories are no longer necessary, and semiconductor device 26 in which the semiconductor elements 1A, mounted on the interposer 5, as the semiconductor elements 1A, are sealed by the insulative resin layer can be mounted, as it is, onto a specified circuit board. Thus, any plant having no semiconductor factories is enabled to easily cope with semiconductor devices.

Also, since the bumps 3 of the plurality of semiconductor elements 1A can be compression-bonded and connected to the electrodes of the interposer 5 in a simultaneous manner without leveling, a task of leveling is no longer necessary, while the wafer 1 can be corrected in terms of warp. Furthermore, it is no longer necessary to give consideration to lot-to-lot thickness variations of wafers, so that a plurality of semiconductor devices can be manufactured simultaneously and collectively with high productivity. In summary, in the wafer-level conventional method including steps of forming bumps on electrodes of a wafer, temporarily compression-bonding the wafer and an interposer together via an insulative resin therebetween, curing the insulative resin by performing heating and pressurization so that the wafer and the interposer are finally compression-bonded, thereby causing the electrodes on the wafer and the electrodes of the interposer to be bonded together, and thereafter cutting and separating individual semiconductor devices from one another, when the wafer and the interposer are bonded together by using ACF or other pressure-bonding techniques, there would arise an issue in that there are involved larger amounts of escape of the insulative resin to peripheries of the wafer, while the insulative resin cannot escape at a central portion of the wafer, thus making it difficult to obtain a uniform bonding at a wafer level. On the other hand, in this first embodiment, in which escape places for the insulative resin of the insulative resin layer 6 during compression-bonding of the wafer 1 and the interposer 5 can be provided by virtue of the grooves 2 being provided at outer peripheries of the individual semiconductor elements 1A on the wafer 1, or at peripheral portions on the interposer 5 side where the semiconductor elements 1A are to be compression-bonded, it becomes possible to allow the insulative resin to escape into the grooves 2 uniformly at both a central portion and peripheral portions within the wafer 1, thus making it possible to obtain a uniform bonding of the wafer 1 and the interposer 5 at a wafer level. Also, when the grooves 2 are formed so as to satisfy a condition that $V2<V1$, where $V1$ (cm$^3$/mm) is the volume of the grooves 2 provided at the outer peripheries of the individual semiconductor elements 1A on the wafer 1, or at the peripheral portions on the interposer side where the semiconductor elements 1A are to be compression-bonded, and $V2$ (cm$^3$/mm) is the insulative-resin overflow volume per unit length around the wafer resulting after compression-bonding of the interposer 5 and the wafer 1 together, it becomes possible to ensure a sufficient escape volume for the insulative resin, so that a uniform compression-bonding of the wafer 1 and the interposer 5 at the wafer level can be obtained more reliably.

Second Embodiment

A semiconductor element mounting method according to a second embodiment of the present invention is described with reference to FIGS. 4A–4C. Although the grooves 2 are provided on the interposer 5 side in the first embodiment, similar effects can be produced also when grooves 2A are provided on wafer 1 side or in both interposer 5 and wafer 1. A case where the grooves 2A are provided on the wafer 1 side is described below as the second embodiment.

Figure 4A:
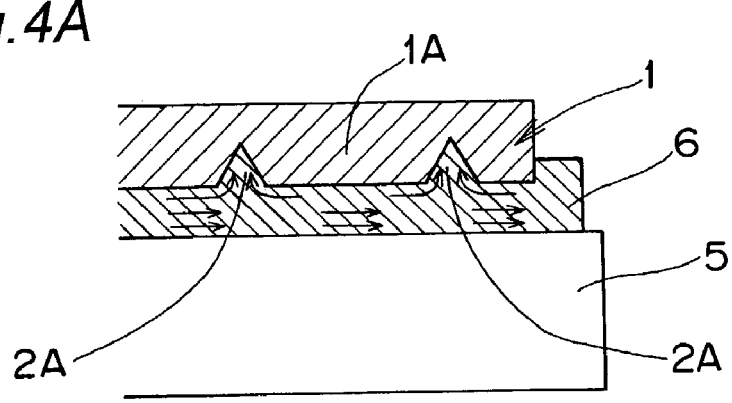
FIGS. 4A, 4B, and 4C are explanatory views, respectively, showing a semiconductor element mounting method according to a second embodiment of the present invention.

FIG. 4A shows flow of insulative resin during compression-bonding of the wafer 1 and the interposer 5 together in a case where the grooves 2A are provided on one side of the wafer 1 to be bonded with the interposer 5, and at outer peripheries of individual semiconductor elements 1A, in such a manner so as to be parallel to one another and formed into a lattice shape.

Referring to FIG. 4A, similar effects can be produced also when the grooves 2A are provided on the wafer 1 side, and a uniform flow of the insulative resin during compression-bonding can be obtained. As a result, a stable electrical connection can be obtained regardless of whether this electrical connection is at the central portion or the peripheral portion of the wafer 1.

Figure 4B:
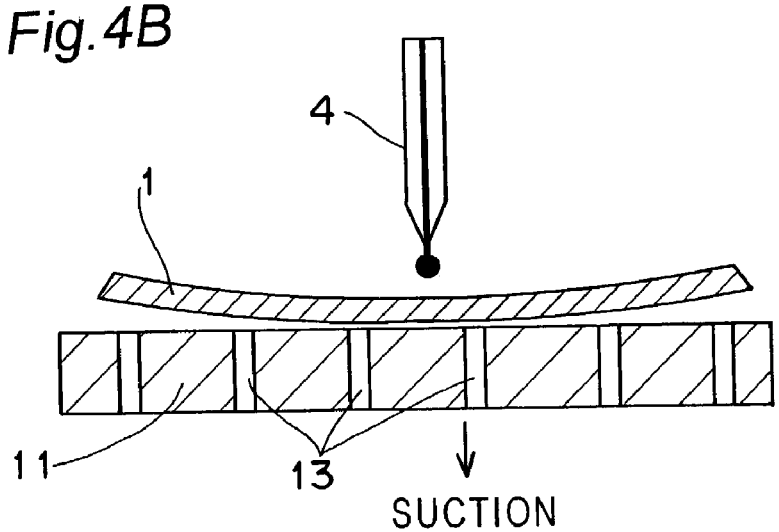
Figure 4C:
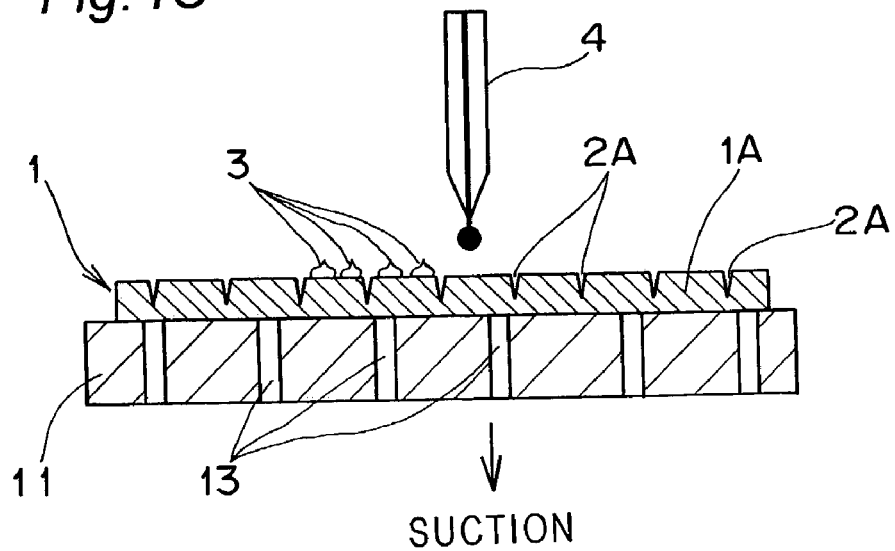

Further effects of the second embodiment are shown in FIGS. 4B and 4C.

As shown in FIGS. 4B and 4C, after the wafer 1 is placed on a flat placement surface on stage 11 of equipment, the wafer 1 is attached onto the stage 11 by suction through a multiplicity of through holes 13 formed through the stage 11, then planarized, and heated to 250° C. by a heater contained in the stage 11. Thereafter, stud bumps 3 are formed on respective electrodes of the wafer 1 from, for example, a 25 µm diameter Au wire (made by Mitsubishi Materials Corp.) by using a capillary 4 attached to a wire bonding apparatus.

This second embodiment can produce the following effects. That is, generally, the wafer 1 has semiconductor elements 1A formed on only one-side surface thereof, thus incurring a warp. Because of this warp, there is a possibility that stud bumps cannot be formed into a stable shape uniformly on the wafer 1 during the stud bump formation process. In contrast to this, with the grooves 2A formed in the wafer 1 as shown in this second embodiment, a stress generated due to formation of the semiconductor elements 1A on only one-side surface of the wafer 1 can be released by the grooves 2A, allowing the wafer 1 to be planarized on the stage 11, so that the stud bumps 3 can be formed in a stable shape.

Third Embodiment

A semiconductor element mounting method according to a third embodiment of the present invention is described with reference to FIG. 5. This third embodiment includes, in each of the embodiments described above or described below, performing heating on a basis of each semiconductor element formation region where stud bumps 3 are to be formed, during a stud bump formation process.

Figure 5:
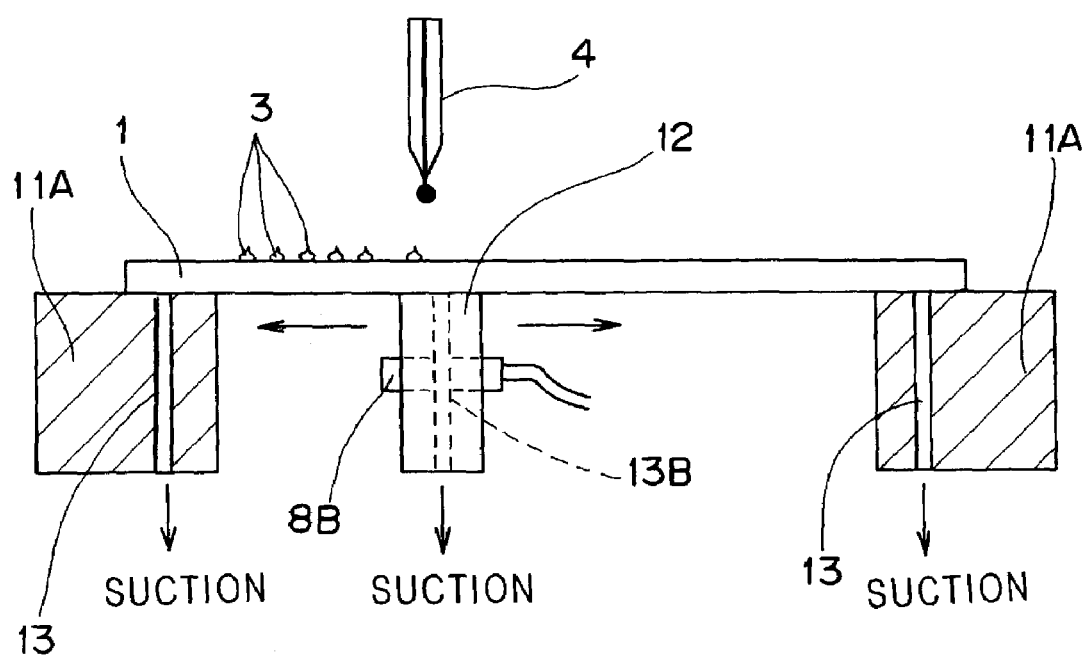
FIG. 5 is an explanatory view showing a semiconductor element mounting method according to a third embodiment of the present invention.

FIG. 5 shows the stud bump formation process.

For formation of the stud bumps 3 on individual electrodes on wafer 1, a peripheral portion of the wafer 1 is sucked and fixed by a first stage 11A, and the wafer 1 is heated by a cartridge heater 8B contained in a second stage 12. During this process, a temperature of the second stage 12 is 250° C. as an example.

Further, the second stage 12 is moved in synchronization with bump formation regions in two directions perpendicular to each other just under a first semiconductor element formation region on the wafer 1 where the stud bumps 3 are to be formed. Then, for formation of bumps of a second semiconductor element formation region, the second stage 12 is moved to the second semiconductor element formation region. It is noted that the second stage 12 also has a through hole 13B formed extending therethrough so that a semiconductor element formation region opposed by the wafer 1 can be sucked and held by suction from below.

Consequently, while only a bump formation region out of a multiplicity of semiconductor element formation regions of the wafer 1, is sucked and held from below by the second stage 12, this held region alone can be heated locally by the cartridge heater 8B.

According to this third embodiment, since only a semiconductor element formation region where the bumps 3 are to be formed is heated selectively and locally, bump formation at a first semiconductor element formation region and bump formation at a last semiconductor element formation region can be made smaller in terms of heat-history difference therebetween, so that a stable strength in terms of bump bonding can be maintained. That is, heating of a wafer for bump formation is performed on a basis of each semiconductor element formation region where the bumps 3 are to be formed, wherein when bump formation at a semiconductor element formation region under heating is terminated, another semiconductor element formation region where bump formation is next to be performed is heated. Like this, bump formation operations and heating operations are synchronized with each other so as to be effected for the same semiconductor element formation region, by which at least a bump formation region alone is heated. As a result, heating time becomes constant and short, which allows alloy layer formation to be reduced and less varied, whereby stabler quality and stabler reliability of bonding can be realized.

Fourth Embodiment

A fourth embodiment of a semiconductor element mounting method according to a fourth embodiment of the present invention is described with reference to FIGS. 6A to 8B. This fourth embodiment includes, as in each of the embodiments described above or described below, protecting bumps 3 or the like with an insulative resin layer 16 after performing a stud bump formation process.

Figure 6A:
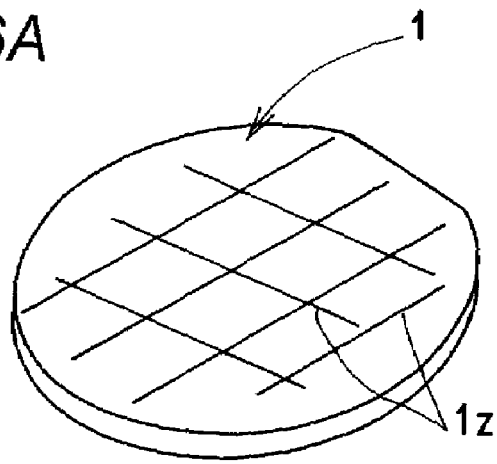
FIGS. 6A, 6B, and 6C are explanatory views, respectively, showing a semiconductor element mounting method according to a fourth embodiment of the present invention.
Figure 6B:
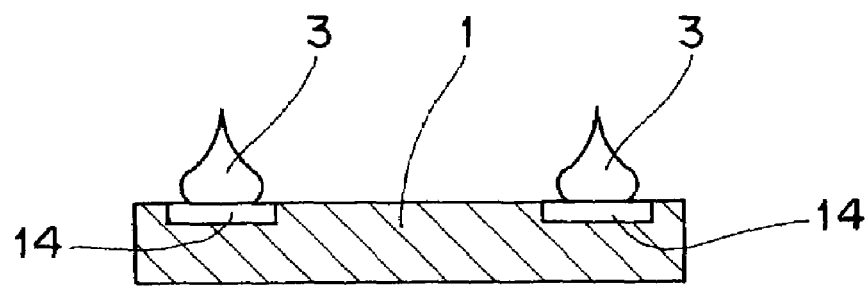
Figure 6C:
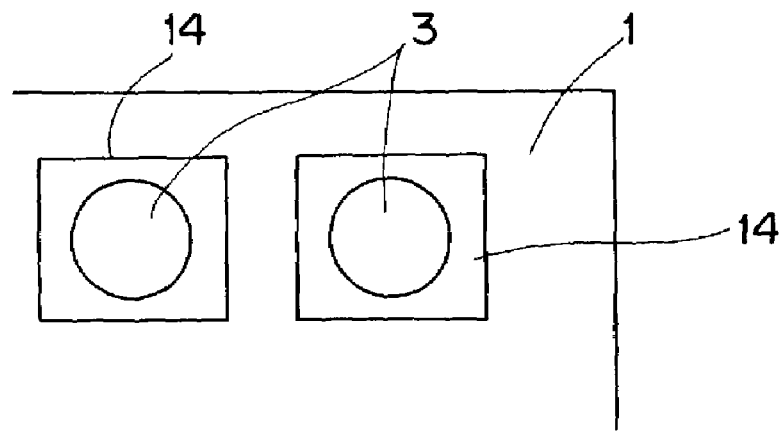

FIGS. 6A–6C show the stud bump formation process.

After wafer 1 is sucked onto an equipment stage, planarized, and heated to, for example, 250° C. from the stage, stud bumps 3 are formed on pads 14, respectively, of the wafer 1 from, for example, a 25 μm diameter Au wire (made by Mitsubishi Materials Corp.) by using a capillary 4 attached to a wire bonding apparatus. Otherwise, plating may be applied onto the pads 14 of the wafer 1 to form bumps.

Figure 7A:
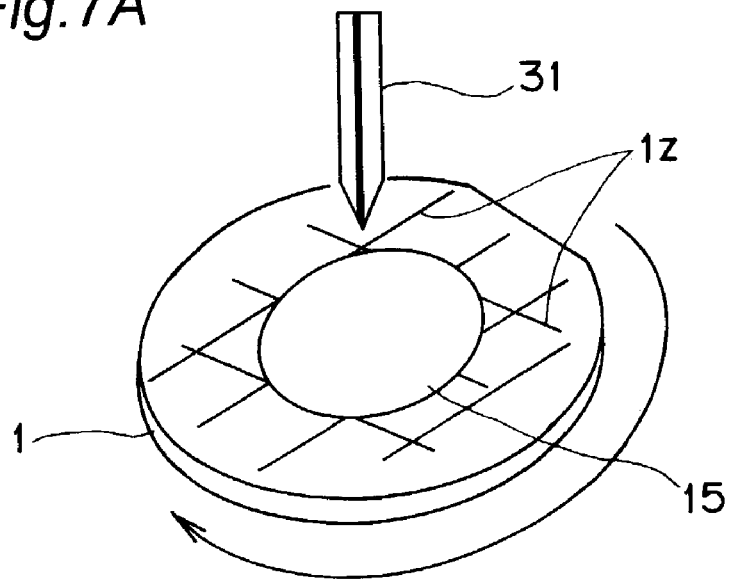
FIGS. 7A, 7B, and 7C are explanatory views, respectively, showing the semiconductor element mounting method according to the fourth embodiment of the present invention, subsequent to FIG. 6C.
Figure 7B:
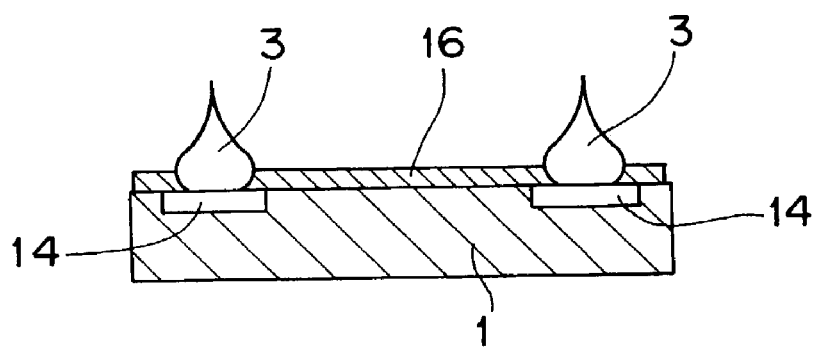
Figure 7C:
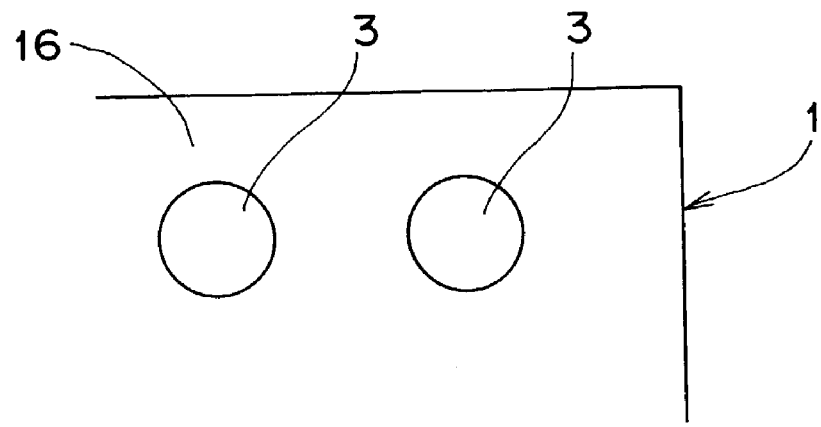

Referring to FIG. 7A, thermosetting insulative resin paste 15 is dripped from a dispenser 31 onto the wafer 1 on which the bumps 3 have been formed, and as shown in FIGS. 7B and 7C, the insulative resin paste 15 is spread on the wafer 1 by a spin coater, by which an insulative resin layer 16 is formed on the wafer 1. The insulative resin layer 16 is then cured by heating, for example, at 150° C. for 30 minutes.

Figure 8A:
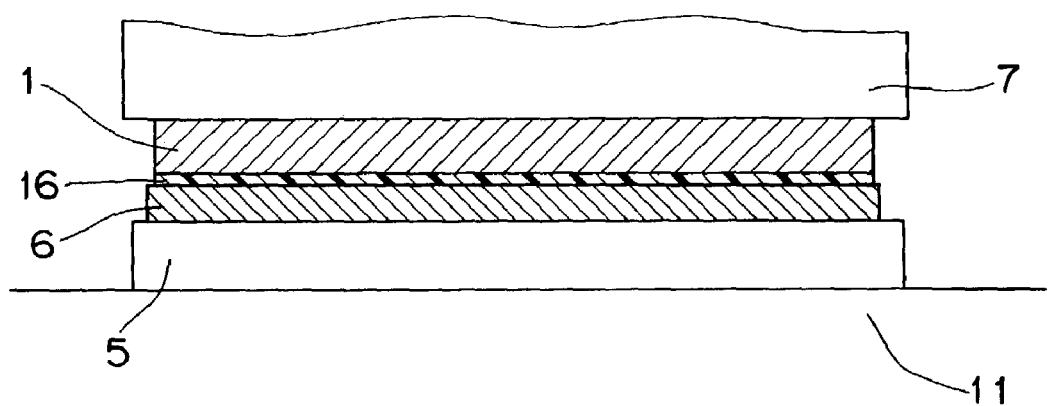
FIGS. 8A and 8B are explanatory views, respectively, showing the semiconductor element mounting method according to the fourth embodiment of the present invention, subsequent to FIG. 7C.

Referring to FIG. 8A, electrodes on interposer 5 and the bumps 3 formed on the wafer 1 are positionally aligned so as to be brought into contact with each other, respectively, and then temporarily compression-bonded by attaching tool 7. This temporary compression-bonding is performed by heating the wafer 1 from the attaching tool 7 to a temperature of, for example, 80° C. under a temporary compression-bonding load of, for example, about 14.7 MPa (150 kgf/cm$^2$). When the wafer 1 is temporarily compression-bonded under these conditions, a reaction rate (curing rate) of the insulative resin layer 16 is, for example, 10%.

Thereafter, in the interposer 5 to which the wafer 1 has been temporarily compression-bonded, a rear surface of the wafer 1 is pressed at a final compression-bonding load of, for example, 44.1 MPa (450 kgf/cm$^2$) and heated to, for example, 200° C., by which final compression-bonding is accomplished. During this process, the bumps 3 on the wafer 1 and the electrodes on the interposer 5 are electrically connected to each other in direct contact through the insulative resin layer 16.

Figure 8B:
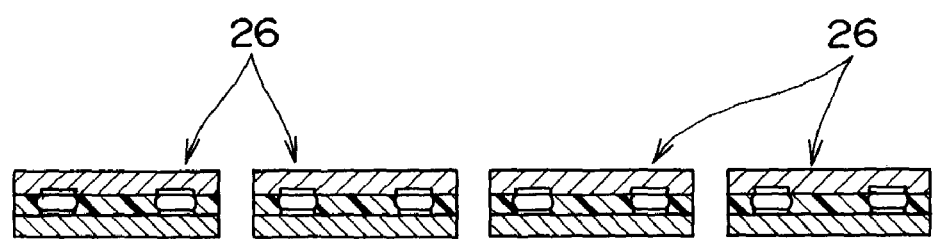

Referring to FIG. 8B, the wafer 1 is divided into individual chips on a semiconductor device basis by using a dicing unit.

As described above, according to the fourth embodiment, with respect to an issue that electrodes of the semiconductor elements 1A, such as Al, would be exposed during stud bump formation on the semiconductor elements 1A, which might in turn cause corrosion of the semiconductor-element electrodes due to moisture absorption after assembling of the semiconductor device, it becomes implementable to prevent this exposure of the electrodes on the semiconductor elements 1A by virtue of an arrangement that the insulative resin layer 16 is formed on the wafer 1 after formation of the stud bumps on the electrodes of the wafer 1 from the Au wire.

In this case, the insulative resin layer 16 on the wafer 1 may be either completely cured or semi-cured, wherein complete curing enhances protection of electrode exposure portions of the semiconductor elements 1A, while semi-curing enhances adhesion to the insulative sealing resin during a later semiconductor-element mounting process, so that the semiconductor device itself can be improved in terms of reliability grade.

Fifth Embodiment

A semiconductor element mounting method according to a fifth embodiment of the present invention is described with reference to FIGS. 9A–10B. This fifth embodiment includes, as in each of the embodiments described above or described below, marking simultaneously on one surface of wafer 1 opposite to semiconductor elements 1A of the wafer 1.

Figure 9A:
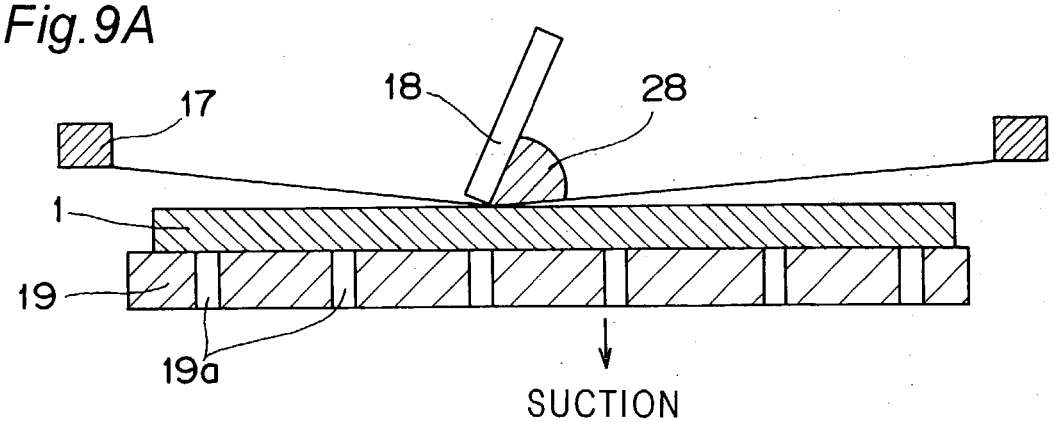
FIGS. 9A, 9B, and 9C are explanatory views, respectively, showing a semiconductor element mounting method according to a fifth embodiment of the present invention.

As shown in FIG. 9A, a semiconductor element formation surface of the wafer 1, on which the semiconductor elements 1A thereof have been formed, is placed on a stage 19, and the semiconductor element formation surface is sucked through suction holes 19a of the stage 19 and held. Thereafter, a screen plate 17 is placed on the surface of the wafer 1 opposite to the semiconductor elements 1A, and a squeegee 18 is moved along with ink 28 on the screen plate 17. Thus, by screen printing in which the ink 28 passing through the through holes of the screen plate 17 is fed to the surface opposite to the semiconductor element 1A, marks 27 are formed by marking with the ink 28 and, subsequently, heated-treated so as to be fixed.

Figure 9B:
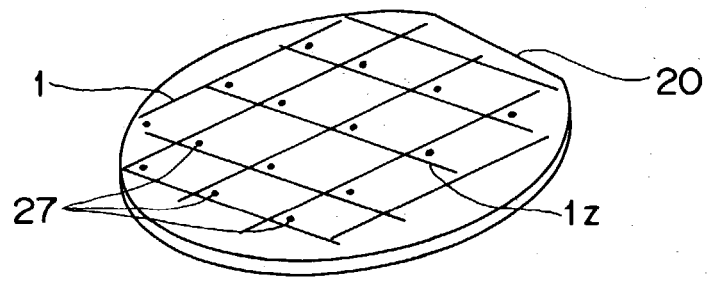
Figure 9C:
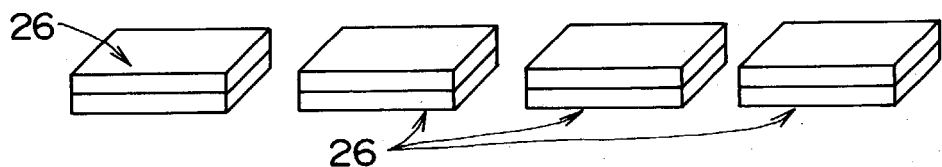

Thereafter, as shown in FIG. 9C, semiconductor devices 26 with the marks 27 provided by marking are produced by dicing in the same manner as in the foregoing embodiment. This marking is used for positioning of electrodes during a process of mounting the semiconductor device 26 to a circuit board, and formed, for example, just above a first pin of semiconductor element 1A. Otherwise, bar codes or other two-dimensional codes, or three dimensional codes may be used instead of the marks 27. Further, in addition to use for positioning, bad marks for quality defects, product numbers, logotypes, lot numbers, or the like may also be formed by screen printing.

Figure 10A:
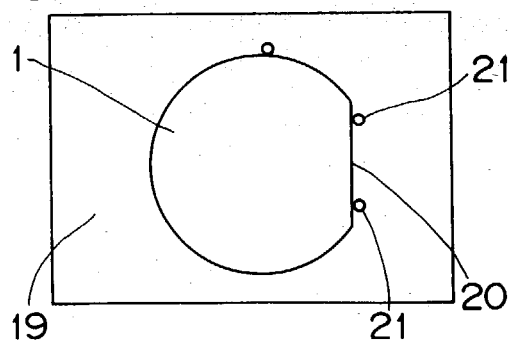
FIGS. 10A and 10B are explanatory views, respectively, showing a semiconductor element mounting method according to the fifth embodiment of the present invention.
Figure 10B:
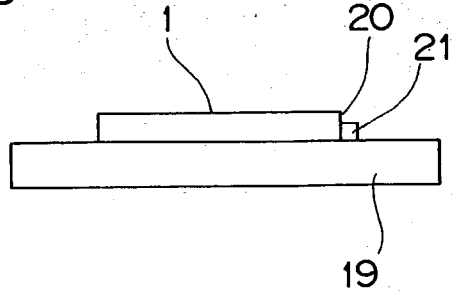

Now, a method of wafer alignment during ink printing is shown in FIGS. 10A and 10B. In marking at a wafer level, generally, a positional relationship between a semiconductor-element surface on which the semiconductor elements 1A are formed and an opposite surface, i.e. a surface opposite to the semiconductor-element surface, is unknown. In this case, through holes could be provided in the semiconductor elements 1A by etching or the like to show the positional relationship between the semiconductor-element surface and the opposite surface, but this would cause an increase in cost. On the other hand, in the fifth embodiment, with use of an orientation flat 20 provided on the wafer 1, as shown in FIGS. 10A and 10B, the orientation flat 20 is set into contact with at least two alignment pins 21 of the stage 19 before bump formation is performed on the wafer 1. Then, positional alignment between the wafer 1 and the screen plate 17 is performed by using this orientation flat 20 as a reference, in which state marking for a desired position of each semiconductor element 1A can be formed on the surface of the wafer 1 opposite to the semiconductor element formation surface by performing screen printing simultaneously for all the semiconductor elements 1A of the wafer 1. Thus, it becomes implementable to accomplish simultaneous marking at a low price and high efficiency. It is noted that solid lines 1z in FIG. 9B are imaginary lines showing boundaries between individual semiconductor elements.

Sixth Embodiment

A semiconductor element mounting method according to a sixth embodiment of the present invention is described with reference to FIGS. 11A–12B. This sixth embodiment includes steps of attaching an insulative resin sheet 6B to wafer 1, then dividing the wafer 1 into semiconductor elements, and thereafter mounting these elements onto interposers 5.

Figure 11A:
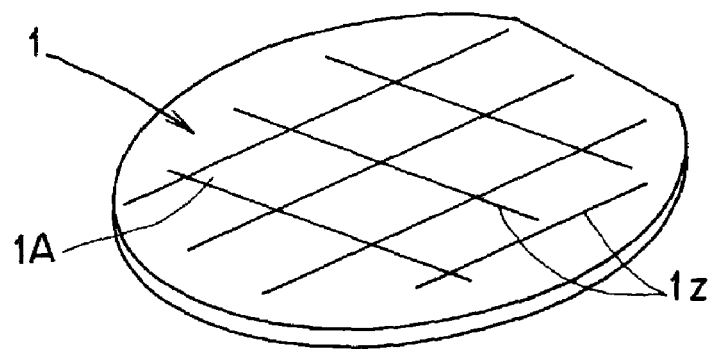
FIGS. 11A, 11B, and 11C are explanatory views, respectively, showing a semiconductor element mounting method according to a sixth embodiment of the present invention.
Figure 11B:
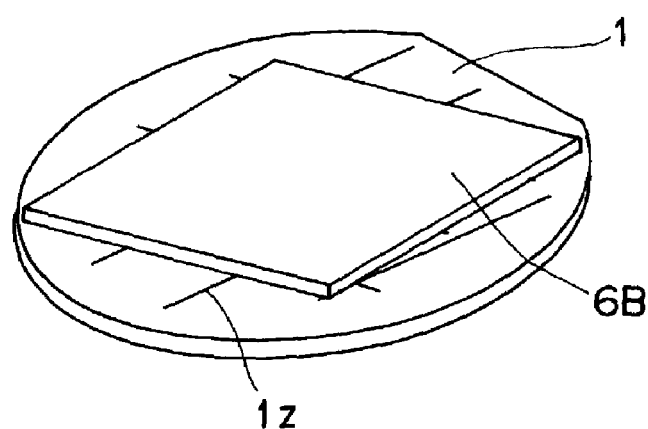
Figure 11C:
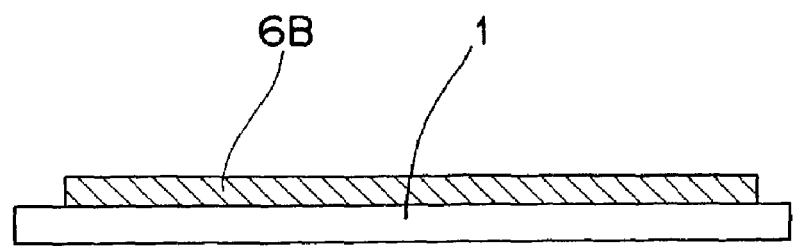

Referring to FIG. 11B, an insulative resin sheet (MJ-932NP; made by Sony Chemicals Corp.) 6B composed mainly of epoxy resin having a thickness of, for example, 60 µm is placed on a semiconductor element formation region of a wafer 1 in FIG. 11A on which stud bumps have been formed, and attaching tool 7 containing cartridge heater 8 shown in FIG. 2A is pressed against the wafer 1 via the insulative resin sheet 6B under conditions of a temperature of 80° C. and a load of about 14.7 MPa (150 kgf/cm$^2$) as an example, by which the insulative resin sheet 6B is stuck to the wafer 1 as shown in FIG. 11C.

Figure 12A:
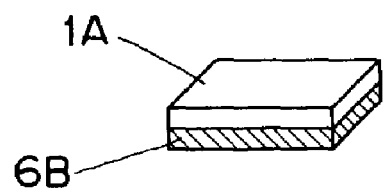
FIGS. 12A and 12B are explanatory views, respectively, showing the semiconductor element mounting method according to the sixth embodiment of the present invention, subsequent to FIG. 11C.

Next, the wafer 1, on which stud bumps 3 have been formed and to which the insulative resin sheet 6B has been stuck, is cut into chips on a basis of each semiconductor element 1A by use of a scriber unit, by which a chip of the semiconductor element 1A is provided as shown in FIG. 12A.

Figure 12B:
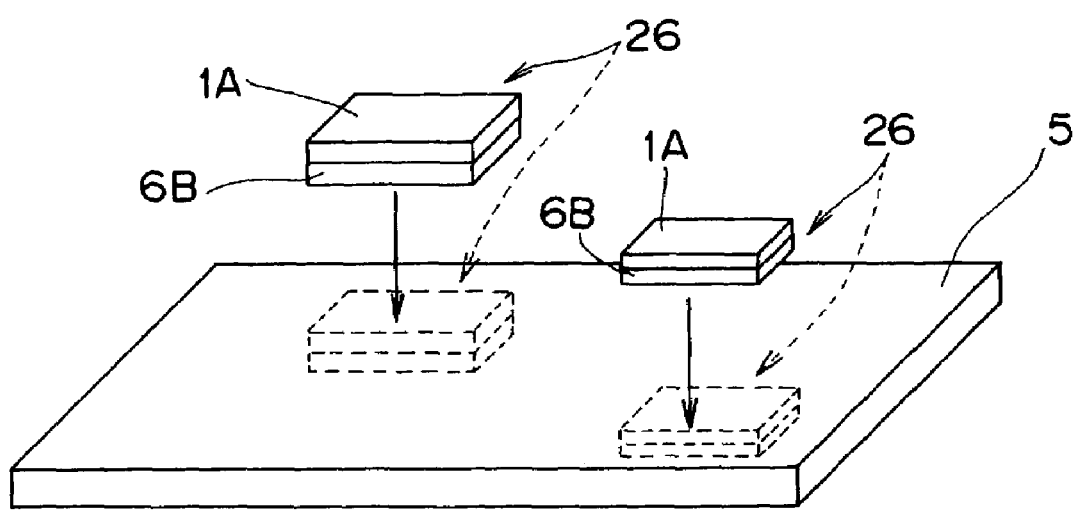

Next, referring to FIG. 12B, electrodes on interposer 5 and the semiconductor element chips are positionally aligned so as to come into contact with the bumps 3, and the semiconductor element chips are temporarily compression-bonded with the interposer 5 by a temporary-compression-bonding mounting head (an example thereof is given by reducing the size of the attaching tool 7, which is the temporary-compression-bonding mounting head of FIG. 2A, in correspondence to the semiconductor element chips). This temporary compression-bonding is performed by heating from the temporary-compression-bonding mounting head under conditions of a temperature of, for example, 80° C. of the semiconductor elements 1A of the wafer 1 and a temporary compression-bonding load of, for example, about 0.637 MPa (6.5 kgf/cm$^2$). When the semiconductor elements 1A of the wafer 1 are temporarily compression-bonded under these temporary compression-bonding conditions, a reaction rate (curing rate) of the insulative resin sheet is, for example, 10%.

Thereafter, against the interposer 5, to which the semiconductor elements 1A of the wafer 1 have been temporarily compression-bonded, rear surfaces of the semiconductor elements 1A of the wafer 1 are pressed with a final compression-bonding load of, for example, about 2.45 MPa (25 kgf/cm$^2$) by a final-compression-bonding mounting head (an example thereof is given by reducing a size of the compression-bonding tool 10, which is the final-compression-bonding mounting head of FIG. 2B, in correspondence to the semiconductor element chips), and heated to, for example, 200° C., by which the semiconductor elements 1A are finally compression-bonded. During this process, the bumps 3 on the semiconductor elements 1A of the wafer 1 and the electrodes on the interposer 5 are electrically connected to each other in direct contact through the insulative resin sheet 6B.

The sixth embodiment can produce the following effects. That is, in the prior art, which includes attaching the ACF to the interposer and thereafter mounting the semiconductor elements, supply of insulative sealing resin for semiconductor elements is performed on a semiconductor element chip basis, which would result in lower productivity. Moreover, attaching the ACF arbitrarily to a specified place of the interposer would pose a complexity for mass-production equipment. Furthermore, in a case where a plurality of semiconductor elements are mounted on one interposer, a plurality of sizes of ACFs need to be prepared in terms of process, which would lead to an increase in cost as well as a complexity in mass production control. In contrast to this, the sixth embodiment includes: a bump formation step for simultaneously forming bumps 3 on electrodes, respectively, of a wafer 1 on which a multiplicity of semiconductor elements 1A have been formed; a step for attaching a sheet-shaped insulative resin sheet 6B onto the wafer 1 and pressing and heating this insulative resin sheet to form an insulative resin layer; a step for cutting the wafer 1 into individual semiconductor elements 1A; and a step for thereafter, positionally aligning the bumps 3 of the semiconductor elements 1A and the electrodes on the interposer 5 with each other, and heating and pressing the semiconductor elements 1A to compression-bond them, by which the semiconductor elements 1A can easily be compression-bonded to one interposer 5 while being resin-sealed by the insulative resin sheet 6B. Consequently, other than supply of the insulative sealing resin on the semiconductor element 1A basis, the insulative sealing resin can be supplied simultaneously to a multiplicity of semiconductor elements 1A in a wafer state, allowing higher productivity to be realized. Moreover, since the insulative resin layer is formed on the semiconductor elements 1A before mounting, it is necessary neither to stick the ACF arbitrarily to a specified place of the interposer, nor to prepare a plurality of sizes of ACFs. Thus, multi-chip modules can easily be manufactured.

Seventh Embodiment

A semiconductor element mounting method according to a seventh embodiment of the present invention is described with reference to FIGS. 13A–13C. This seventh embodiment includes a step of stacking a plurality of wafers 1-1, 1-2 on interposer 5.

Figure 13A:
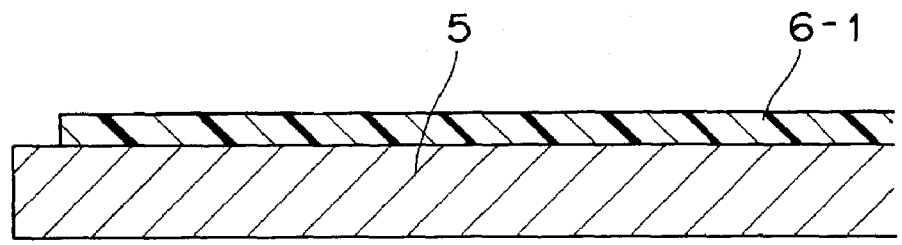
FIGS. 13A, 13B, and 13C are explanatory views, respectively, showing a semiconductor element mounting method according to a seventh embodiment of the present invention.

Referring to FIG. 13A, on an interposer 5 (FR-5; made by NEC Corp.) made of glass epoxy as an example, an insulative resin sheet 6-1 (MJ-932NP; made by Sony Chemicals Corp.) composed mainly of epoxy resin having a thickness of 60 µm is placed at a semiconductor element formation region, and the insulative resin sheet 6-1 is pressed against first wafer 1-1 with the attaching tool 7 containing the cartridge heater 8 shown in FIG. 2A under conditions of a temperature of 80° C. and a load of about 14.7 MPa (150 kgf/cm$^2$) as an example, by which the insulative resin sheet 6-1 is stuck to the first wafer 1-1.

Figure 13B:
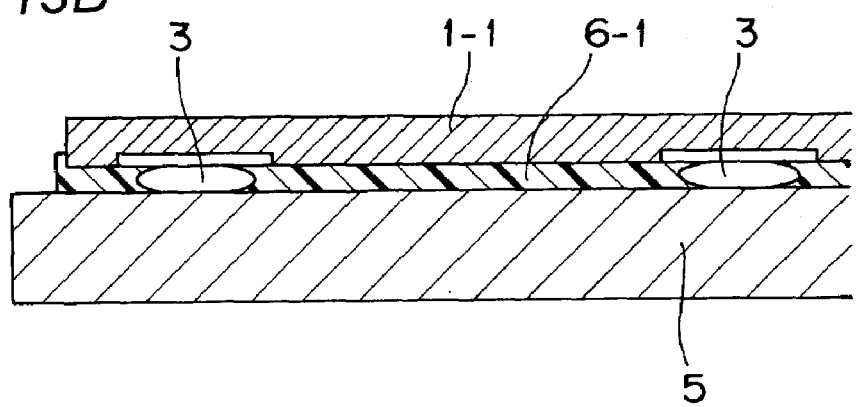

Referring to FIG. 13B, electrodes on the interposer 5 and bumps 3 formed at pad electrodes 1a of the first wafer 1-1 are positionally aligned so as to be opposed to each other with the insulative resin sheet 6-1 interposed therebetween, and then temporarily compression-bonded by a temporary-compression-bonding mounting head 8 as shown in FIG. 2A. This temporary compression-bonding is performed by heating from the temporary-compression-bonding mounting head 8 under conditions of a temperature of 80° C. of the first wafer 1-1 and a temporary compression-bonding load of about 14.7 MPa (150 kgf/cm$^2$) as an example. When the first wafer 1-1 is temporarily compression-bonded under these temporary compression-bonding conditions, a reaction rate (curing rate) of the insulative resin sheet 6-1 is, for example, 10%.

Thereafter, with the interposer 5, to which the first wafer 1-1 has been temporarily compression-bonded, a rear surface of the first wafer 1-1 is pressed against the interposer 5 with a final compression-bonding load of, for example, about 44.1 MPa (450 kgf/cm$^2$) and heated to, for example, 200° C., by which the first wafer 1-1 is finally compression-bonded. As a result, the electrodes on the interposer 5 and the bumps 3 formed at pad electrodes, respectively, of the first wafer 1-1 are electrically connected to each other via direct contact through the insulative resin sheet 6-1.

Figure 13C:
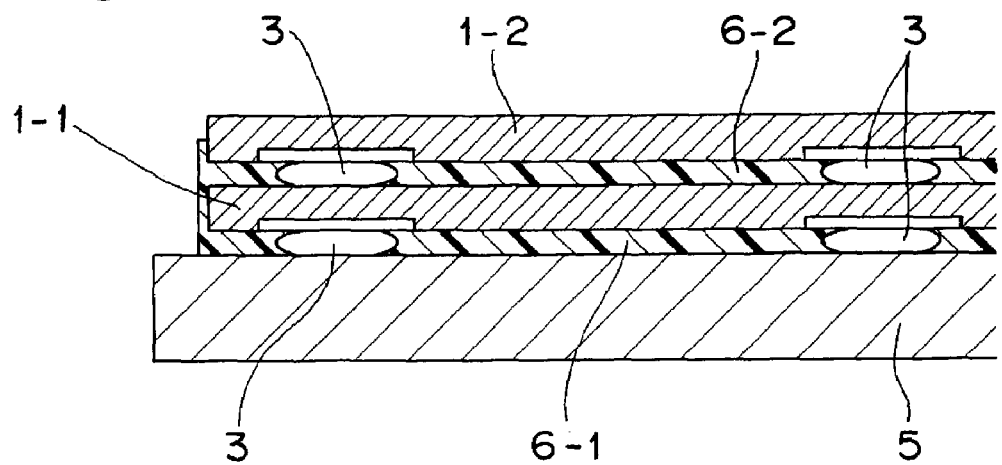

Next, referring to FIG. 13C, electrodes previously formed on one-side surfaces of the first semiconductor elements 1A of the first wafer 1-1, with the one-side surfaces not facing the interposer 5, and bumps 3 formed on second semiconductor elements 1A of the second wafer 1-2, are positionally aligned with each other so as to be opposed to each other with an insulative resin sheet 6-2 interposed therebetween, and then temporarily compression-bonded by a temporary-compression-bonding mounting head 8 as shown in FIG. 2A. It is noted that bumps are disposed at coincident positions between the first semiconductor elements 1A of the first wafer 1-1 and the second semiconductor elements 1A of the second wafer 1-2. This temporary compression-bonding is performed by heating with the temporary-compression-bonding mounting head 8 under conditions of a temperature of 80° C. of the second wafer 1-2 and a temporary compression-bonding load of about 14.7 MPa (150 kgf/cm$^2$) as an example. When the second wafer 1-2 is temporarily compression-bonded to the first wafer 1-1 under these temporary compression-bonding conditions, a reaction rate (curing rate) of the insulative resin sheet 6-2 is, for example, 10%.

Thereafter, against the interposer 5, in which the second wafer 1-2 has been temporarily compression-bonded to the first wafer 1-1, a rear surface of the second wafer 1-2 is pressed with a final compression-bonding load of about 44.1 MPa (450 kgf/cm$^2$) and heated to 200° C. as an example, by which the second wafer 1-2 is finally compression-bonded. During this process, the bumps 3 on the second wafer 1-2 and the electrodes of the first wafer 1-1 are electrically connected to each other via direct contact through the insulative resin sheet 6-2.

Moreover, similar connection resistance can be obtained also by bonding both the first semiconductor elements 1A of the first wafer 1-1 and the second semiconductor elements 1A of the second wafer 1-2 simultaneously by performing heating and pressurization.

According to this seventh embodiment, during wafer-level manufacture of semiconductor devices each of which is formed by stacking on the single interposer 5 the wafers 1-1, 1-2, i.e. a plurality of semiconductor elements 1A, bonding between the first wafer 1-1 and the interposer 5 and bonding between the first wafer 1-1 and the second wafer 1-2 are fulfilled independently of each other by directly connecting their electrodes and bumps to each other, respectively. Therefore, when the first wafer 1-1 and the second wafer 1-2 are bonded together after the bonding of the first wafer 1-1 and the interposer 5, sufficient bonding of the first wafer 1-1 and the second wafer 1-2 can be achieved even if the first wafer 1-1 is bent. Thus, whereas using as a stacking technique an ACF or other pressure-bonding technique involving pressurization and heating as in the prior art would involve an issue of insufficient electrical bonding between upper and lower layers due to bending of a lower-layer side wafer during pressurization, the seventh embodiment can reliably eliminate such an issue.

Eighth Embodiment

A semiconductor element mounting method according to an eighth embodiment of the present invention is described with reference to FIGS. 14A–15C. This eighth embodiment includes, in addition to features of the seventh embodiment, a step of bonding with use of orientation flats 20 set coincident with each other so that crystal structure planes of two wafers 1-1, 1-2 are aligned with each other.

Figure 14A:
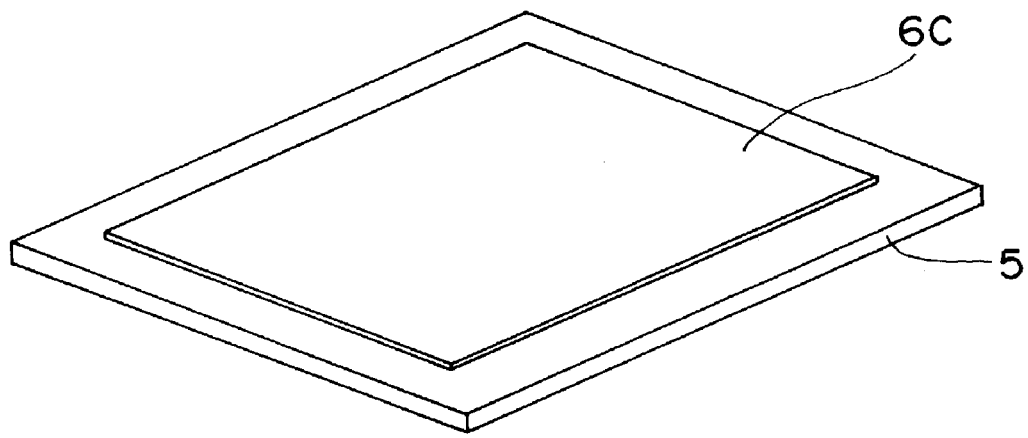
FIGS. 14A and 14B are explanatory views, respectively, showing a semiconductor element mounting method according to an eighth embodiment of the present invention.

Referring to FIG. 14A, on an interposer 5 (FR-5; made by NEC Corp.) made of glass epoxy, an insulative resin sheet 6C (MJ-932NP; made by Sony Chemicals Corp.) composed mainly of epoxy resin having a thickness of, for example, 60 μm is placed at a region of first wafer 1-1 where a semiconductor element formation region is to be mounted, and the insulative resin sheet 6C is pressed and stuck to the interposer 5 by an attaching tool containing a cartridge heater under conditions of, for example, a temperature of 80° C. and a load of about 14.7 MPa (150 kgf/cm$^2$).

Figure 14B:
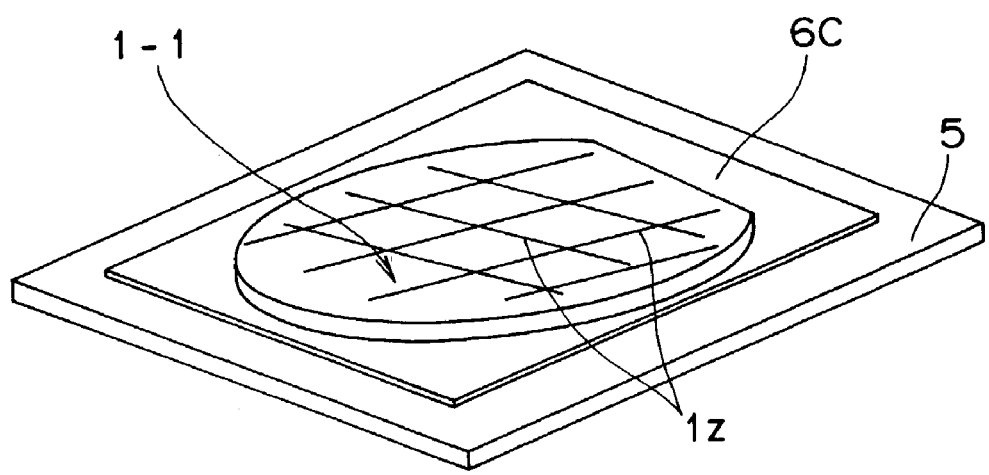

Referring next to FIG. 14B, electrodes on the interposer 5 and bumps 3 formed on the first wafer 1-1 are positionally aligned so as to be opposed to each other with the insulative resin sheet 6C interposed therebetween, and then the first wafer 1-1 is temporarily compression-bonded to the interposer 5 by a temporary-compression-bonding mounting head with the insulative resin sheet 6C interposed therebetween. This temporary compression-bonding is performed by heating with the temporary-compression-bonding mounting head under conditions of, for example, a temperature of 80° C. of the first wafer 1-1 and a temporary compression-bonding load of, for example, about 14.7 MPa (150 kgf/cm$^2$). When the first wafer 1-1 is temporarily compression-bonded to the interposer 5 with the insulative resin sheet 6C interposed therebetween under these temporary compression-bonding conditions, a reaction rate (curing rate) of the insulative resin sheet 6C is, for example, 10%.

Thereafter, against the interposer 5, to which the first wafer 1-1 has been temporarily compression-bonded, a rear surface of the first wafer 1-1 is pressed with a final compression-bonding load of, for example, about 44.1 MPa (450 kgf/cm$^2$) and heated to, for example, 200° C., by which the first wafer 1-1 is finally compression-bonded. As a result, bumps 3 of the semiconductor elements 1A of the first wafer 1-1 and electrodes on the interposer 5, respectively, are electrically connected to each other via direct contact through the insulative resin sheet 6C.

Figure 15A:
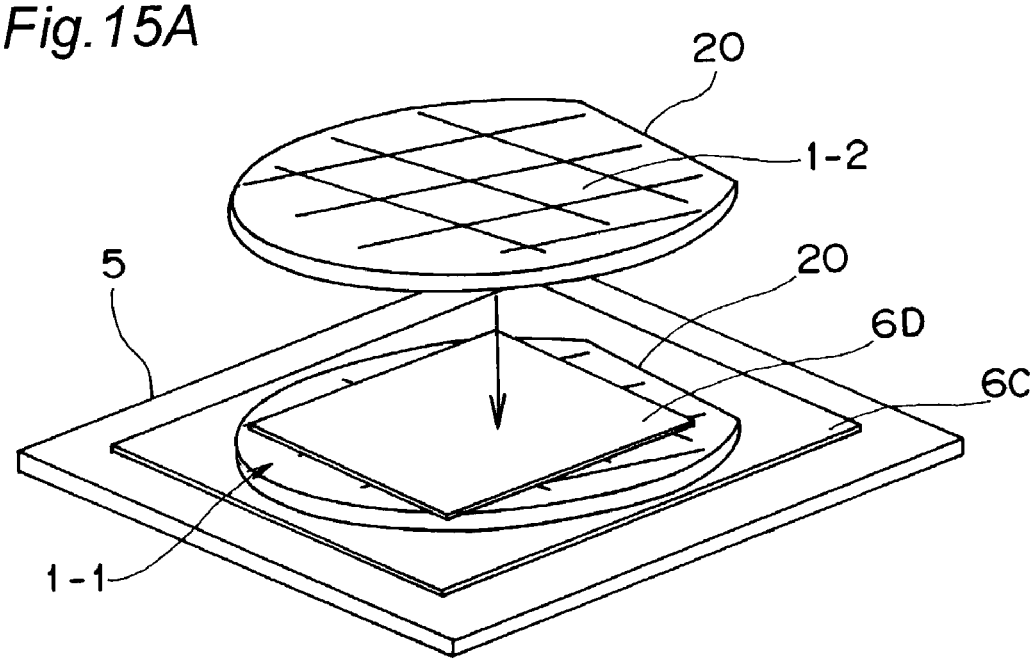
FIGS. 15A, 15B, and 15C are explanatory views, respectively, showing the semiconductor element mounting method according to the eighth embodiment of the present invention, subsequent to FIG. 14B.

Next, referring to FIG. 15A, electrodes previously formed on one-side surfaces of first semiconductor elements 1A of the first wafer 1-1, with the one-side surfaces not facing the interposer 5, and bumps 3 formed on second semiconductor elements 1A of the second wafer 1-2, are positionally aligned with each other so as to be opposed to each other with an insulative resin sheet 6D interposed therebetween, and then temporarily compression-bonded by a mounting head. During this process, the orientation flats 20 are set coincident with each other during bonding so that crystal planes of the first wafer 1-1 and second wafer 1-2 are aligned with each other. This temporary compression-bonding is performed by heating with the temporary-compression-bonding mounting head under conditions of a temperature of 80° C. of the second wafer 1-2 and a temporary compression-bonding load of about 14.7 MPa (150 kgf/cm$^2$) as an example. When the second wafer 1-2 is temporarily compression-bonded to the first wafer 1-1 with the insulative resin sheet 6D under these temporary compression-bonding conditions, a reaction rate (curing rate) of the insulative resin sheet 6D is, for example, 10%.

Thereafter, against the interposer 5 having the first wafer 1-1, to which the second wafer 1-2 has been temporarily compression-bonded, a rear surface of the second wafer 1-2 is pressed with a final compression-bonding load of about 44.1 MPa (450 kgf/cm$^2$) and heated to 200° C. as an example, by which the second wafer 1-2 is finally compression-bonded. During this process, bumps 3 on the second wafer 1-2 and electrodes on the interposer 5 are electrically connected to each other via direct contact through the insulative resin sheet 6D.

Moreover, similar connection resistance can be obtained also by bonding both the first semiconductor elements 1A of the first wafer 1-1 and the second semiconductor elements 1A of the second wafer 1-2 simultaneously by performing heating and pressurization.

This eighth embodiment can produce the following effects. That is, with regard to a semiconductor device formed by stacking a plurality of semiconductor elements 1A, prior-art methods, in which cutting into individual chips is effected after stacking of wafers, might incur defects or cracks of the semiconductor elements due to orientation differences of semiconductor crystal planes between upper and lower layers. By contrast, in the eighth embodiment, in which wafer crystal planes of the first wafer 1-1 and the second wafer 1-2 are aligned with each other during wafer stacking by aligning the orientation flats 20 with each other, occurrence of defects or cracks when cutting into chips can be prevented.

Ninth Embodiment

Figure 16:
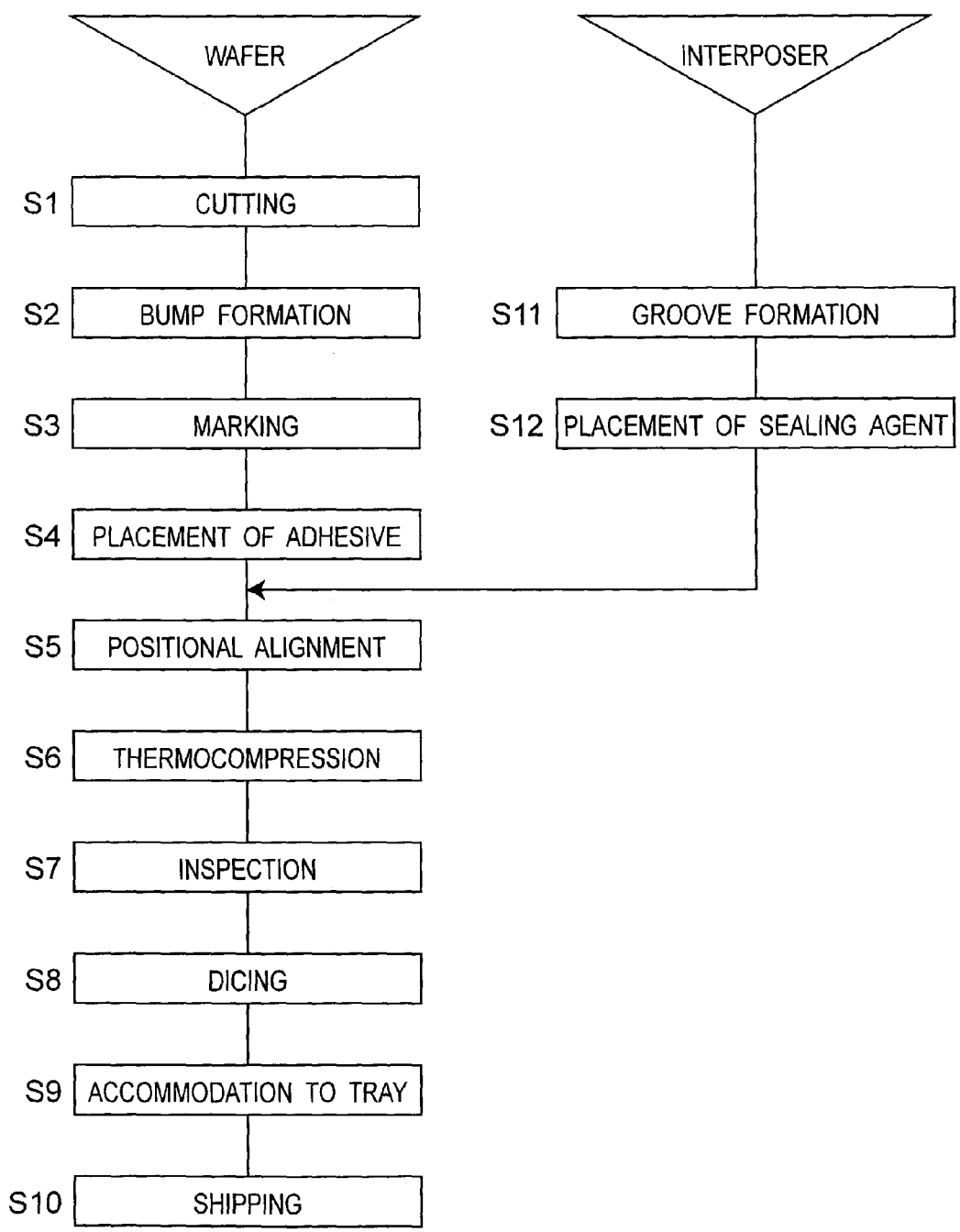
FIG. 16 is a flow chart showing a semiconductor element mounting method according to a ninth embodiment of the present invention.

A semiconductor element mounting method according to a ninth embodiment of the present invention is described with regard to more specific steps in performing semiconductor element mounting methods according to the foregoing embodiments, as shown in FIG. 16.

Figure 17A:
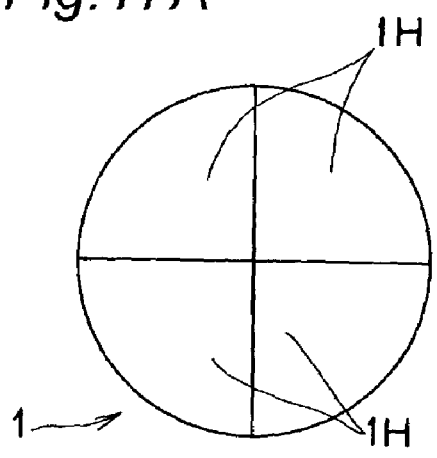
FIGS. 17A, 17B, 17C, 17D, and 17E are explanatory views, respectively, showing a wafer used in a semiconductor element mounting method according to the ninth embodiment of the present invention.
Figure 17B:
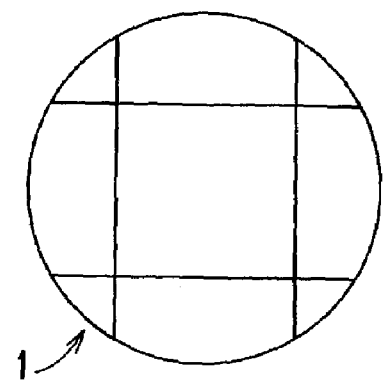
Figure 17C:
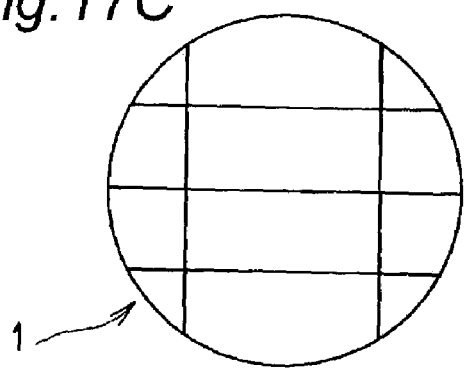
Figure 17D:
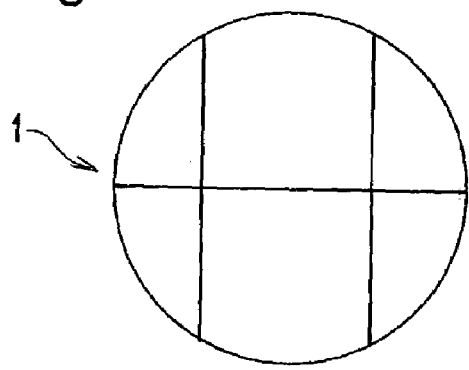
Figure 17E:
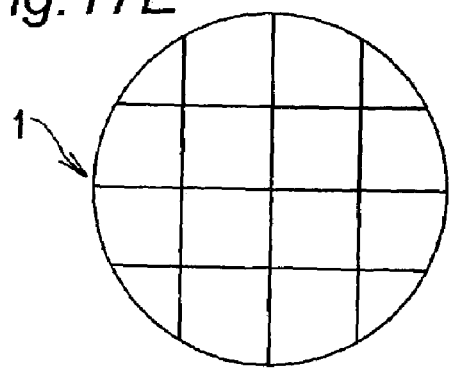

Referring to FIG. 16, during a wafer cutting operation of step S1, insulative-resin overflow grooves 2, 2A, to coincide with dicing lines serving as boundaries for individual semiconductor elements 1A, are formed, as required, in an active surface of one wafer 1. In this case, as required, the wafer 1 is not limited to use of one wafer 1 as it is, and the wafer 1 may be divided arbitrarily into halves, quarters, eighths, or the like for subsequent applications of the following steps to such a divided wafer. Examples of this division of the wafer 1 are shown in FIGS. 17A–17E. FIG. 17A shows an example of dividing the wafer 1 into quarters, FIG. 17B shows an example of dividing the wafer 1 into three longitudinal columns and three traverse rows as viewed in this figure, FIG. 17C shows an example of dividing the wafer 1 into three longitudinal columns and three traverse rows as viewed in this figure, FIG. 17D shows an example of dividing the wafer 1 into three longitudinal columns and three traverse rows as viewed in this figure, and FIG. 17E shows an example of dividing the wafer 1 into four longitudinal columns and four traverse rows as viewed in this figure. It is noted that longitudinal and traverse lines in FIGS. 17A–17E may be regarded as locations of the grooves 2 in the first embodiment, instead of being regarded as divisional lines of the wafer as described above. That is, not that the grooves 2 are formed along all dicing lines, but the grooves 2 may be formed along arbitrary dicing lines out of a multiplicity of dicing lines, exemplified by such modes as FIG. 17A including one longitudinal and one traverse groove 2 as viewed in this figure, FIG. 17B including two longitudinal and two traverse grooves 2 as viewed in this figure, FIG. 17C including two longitudinal and three traverse grooves 2 as viewed in this figure, FIG. 17D including two longitudinal and one traverse grooves 2 as viewed in this figure, and FIG. 17E including three longitudinal and three traverse grooves 2 as viewed in this figure. Accordingly, in these cases, the grooves 2 are formed not on a basis of each semiconductor element 1A but on bases of a plurality of semiconductor elements 1A.

It is noted that a wafer cutting operation of this step S1 may be omitted as the case may be.

Next, during a bump formation operation of step S2, bumps 3 are formed on pads (see FIGS. 13A–13C), respectively, which are electrodes of individual semiconductor elements 1A, by performing wire bonding. During this process, heating may be performed in units of each semiconductor element formation region, for example, by employment of the third embodiment.

Next, during a marking operation of step S3, marking for use of positioning during mounting to a circuit board is performed on one surface of the wafer 1 other than a bump formation surface. In this case, for example, simultaneous marking can be performed by employment of the fifth embodiment.

Next, during an adhesive placement operation of step S4, insulative resin serving as an adhesive is placed on a wafer 1 side or interposer 5 side, thereby forming an insulative resin layer 6. Formation of the insulative resin layer 6 is performed by virtue of application or coating of insulative resin, attaching of an insulative resin sheet, or the like.

Meanwhile, for the interposer 5, there are steps S11 and S12.

During a groove formation operation of step S11, grooves 2, 2A to coincide with dicing lines as boundaries for individual semiconductor elements 1A are formed in the interposer 5, as required. It is noted that if there is no need for forming the grooves in the interposer 5, the groove formation operation of step S11 can be omitted.

During a sealing agent placement operation of step S12, as required, insulative resin such as polyimide is spin-coated to cover electrode-exposed surfaces of the interposer 5. It is noted that when there is no need for covering electrode-exposed surfaces of the interposer 5, the sealing agent placement operation of step S12 may be omitted.

Next, during an alignment operation of step S5, positional alignment is performed between the interposer 5 sucked and held to the stage 11, 11A, and a plurality of semiconductor elements 1A of the wafer 1 sucked and held to a temporary-compression-bonding mounting head (as an example, the attaching tool 7 of FIG. 2A is used).

Next, during a thermocompression bonding operation of step S6, the plurality of semiconductor elements 1A of the wafer 1 sucked and held to a temporary-compression-bonding tool are heated and pressed, thereby being temporarily compression-bonded, to the interposer 5 sucked and held to the stage 11, 11A via the insulative resin layer 6. Thereafter, these temporarily compression-bonded plurality of semiconductor elements 1A of the wafer 1 are finally compression-bonded to the interposer 5 with a higher temperature and a larger pressure than that utilized during the temporary compression-bonding by utilizing a final-compression-bonding mounting head (as an example, the compression-bonding tool 10 in FIG. 2B is used). That is, the wafer 1 and the interposer 5 are finally compression-bonded to each other by curing the insulative resin layer 6, by which the bumps 3 of the plurality of semiconductor elements 1A on the wafer 1 and the electrodes on the interposer 5 are bonded together. By thermocompression bonding of such temporary compression-bonding and final compression-bonding, the wafer 1 and the interposer 5 can be compression-bonded to each other while they are subjected to warp correction without leveling of the bumps 3.

Next, during an inspection operation of step S7, individual semiconductor elements 1A of bonded unit 30 formed by thermocompression bonding are inspected for operations such as electrical characteristics thereof.

Back-grinding of the bonded unit 30, if performed either before or after the inspection step, allows an entire bonded unit to be thinned. It is easier to accomplish this thinning by simultaneously thinning a multiplicity of semiconductor devices, as opposed to performing back-grinding in units of each semiconductor device chip. Moreover, thinning in units of each semiconductor device would involve a difficulty in performing back-grinding because of warps of the chip itself, whereas the simultaneous method is free from such issues as shown above.

Next, during a dicing operation of step S8, a dicing process is performed on the bonded unit 30 in units of each semiconductor element 1A so that the semiconductor elements 1A are cut and separated from one another, by which semiconductor devices 26 are formed in units of each semiconductor element 1A.

Next, during a tray accommodation operation of step S9, the semiconductor devices 26 are accommodated into trays.

During a shipping operation of step S10, a multiplicity of semiconductor devices 26, which are accommodated in the trays, are shipped out in trays.

Through performance of these steps, semiconductor devices 26 manufactured by simultaneously subjecting wafers to compression-bonding with the interposer 5 and sealing with insulative resin, can be shipped out as they are accommodated in trays.

Figure 18:
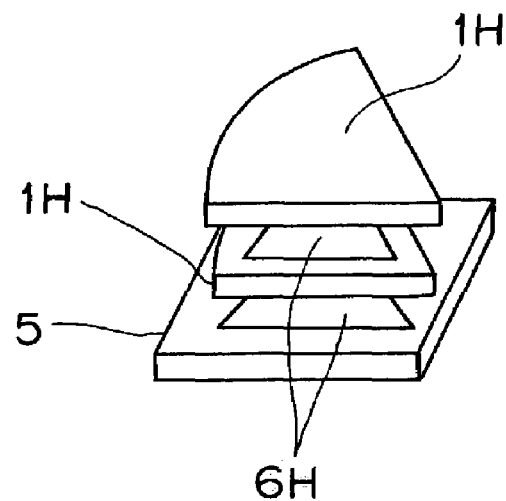
FIG. 18 is an explanatory view showing a semiconductor element mounting method in which the ninth embodiment of the present invention is applied to the sixth embodiment.

Also, in the foregoing embodiments, as described above, the wafer 1 is not limited to use of one wafer 1 as it is, and the wafer 1 may be divided arbitrarily into halves, quarters, eighths, or the like as shown in FIGS. 17A–17E and then the foregoing embodiments may be applied to each of these divided wafers. For example, in the case of application to the sixth embodiment, as shown in FIG. 18, with use of two of divisions 1H (see FIG. 17A), each division 1H resulting from dividing one wafer 1 into quarters, the steps may include: bonding a first division 1H to interposer 5 by temporarily compression-bonding and finally compression-bonding via an insulative resin sheet 6H having a shape generally identical to the division 1H or a triangular shape, and thereafter temporarily compression-bonding and finally compression-bonding a second division 1H onto the first division 1H via an insulative resin sheet 6H having a shape generally identical to the division 1H or a triangular shape. Like this, when a mounting operation is performed in the form of not one wafer but divisional units, a pressurization force can be made smaller than in the case of one wafer, and in some cases, the need for grooves 2 is eliminated, and moreover handling is facilitated even with back-grinding applied for thinning. Further, in the case where divisional units resulting from division of the same wafer are stacked as in the sixth or seventh embodiment (see, for example, FIG. 18), a mounting operation is facilitated by the same thickness.

Tenth Embodiment

Figure 19:
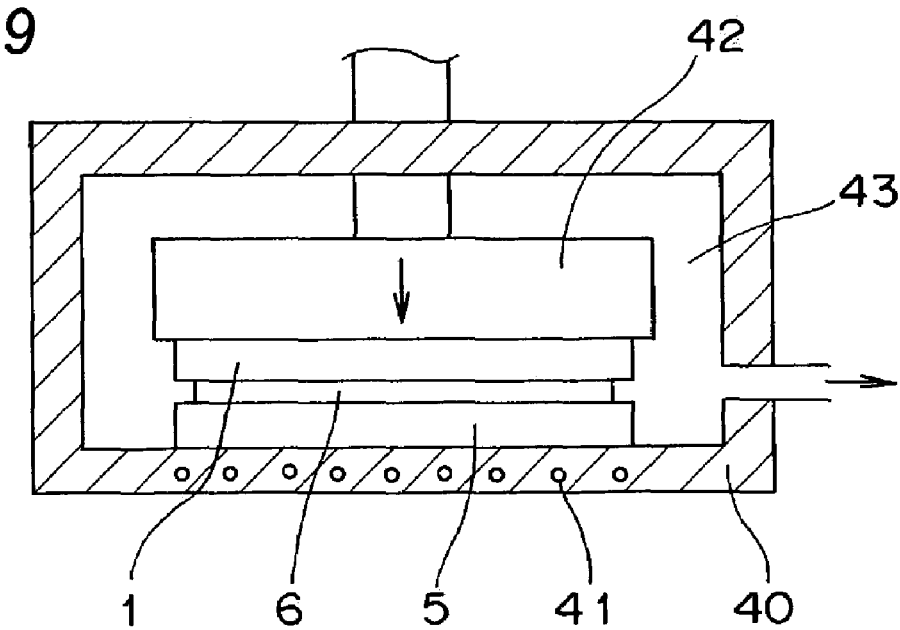
FIG. 19 is an explanatory view showing a semiconductor element mounting method according to a tenth embodiment of the present invention.
Figure 20A:
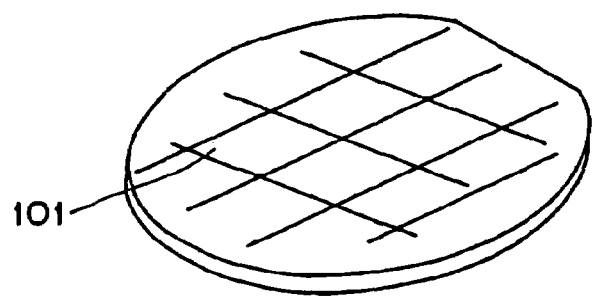
FIGS. 20A, 20B, and 20C are explanatory views, respectively, showing a semiconductor element mounting method to an interposer according to the prior art.
Figure 20B:
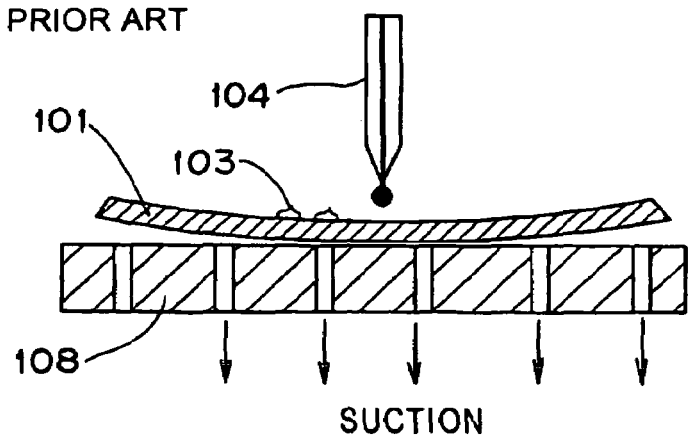
Figure 20C:
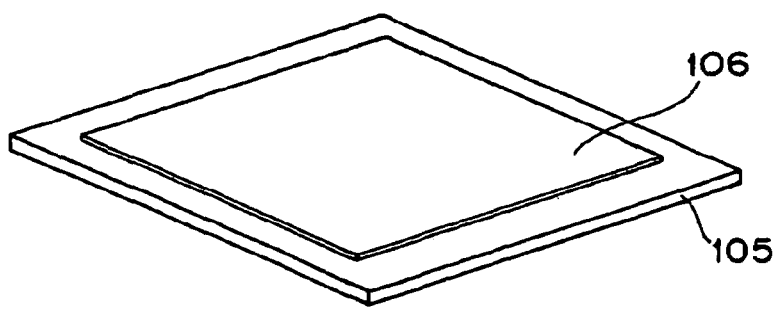
Figure 21A:
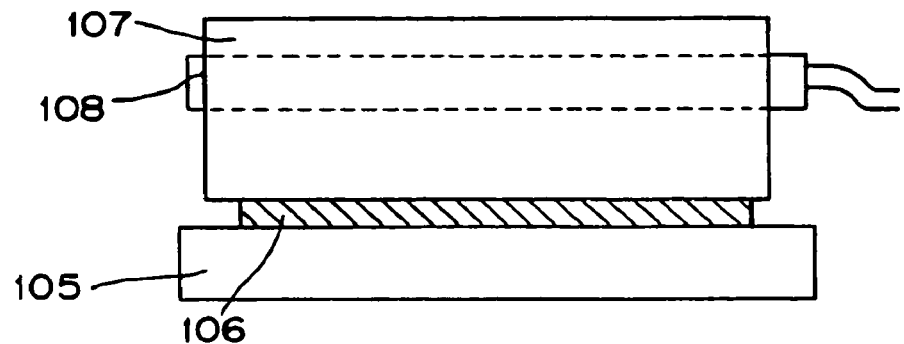
FIGS. 21A, 21B, and 21C are explanatory views showing the semiconductor element mounting method to the interposer according to the prior art, subsequent to FIGS. 20A–20C.
Figure 21B:
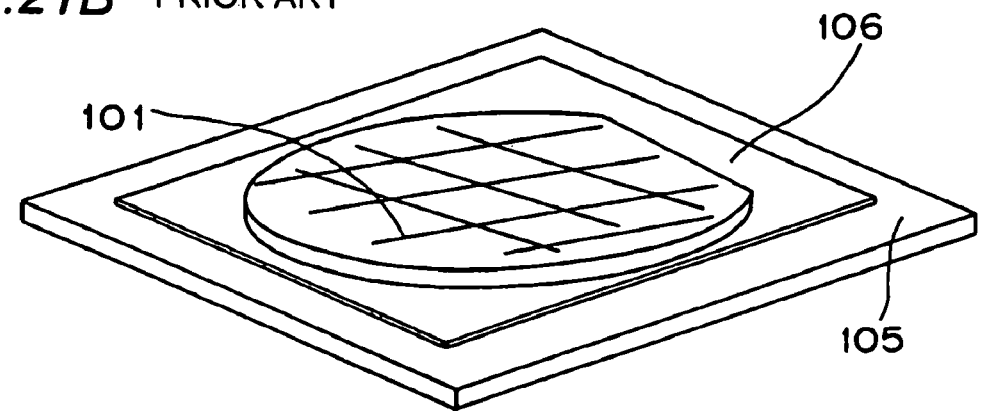
Figure 21C:
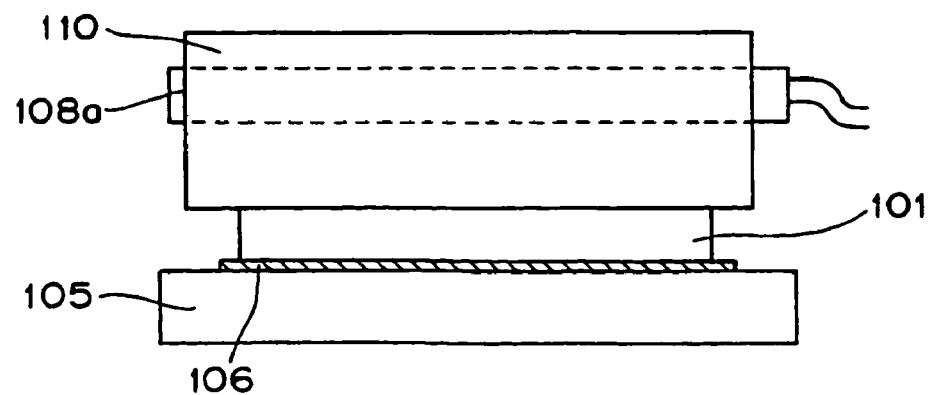
Figure 22:
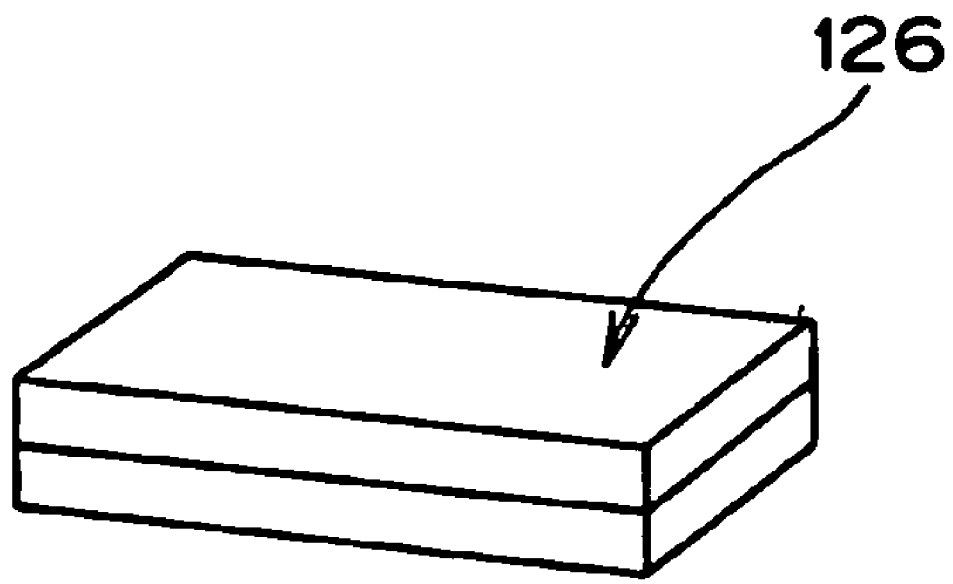
FIG. 22 is an explanatory view showing the semiconductor element mounting method to the interposer according to the prior art, subsequent to FIGS. 21A–21C.

In a semiconductor element mounting method according to a tenth embodiment of the present invention, as shown in FIG. 19, this process may include steps of: placing an interposer 5, a resin sheet or other resin layer, and a wafer 1 in an interior 43 of a vacuum chamber 40; performing temporary compression-bonding and final compression-bonding by utilizing a temporary-compression-bonding and final-compression-bonding mounting head 42 under a vacuum state or pressure-reduced state while heating is performed by a heater 41 provided at a bottom portion of the vacuum chamber 40. In this case, a pressurization force can be made smaller, and a uniform pressurization force can be made to act on the interposer 5, the resin sheet or other resin layer, and the wafer 1, and furthermore elimination of foams from the resin sheet or other resin layer is facilitated.

WORKING EXAMPLES

Hereinbelow, working examples of the semiconductor element mounting method according to the foregoing various embodiments of the present invention are described with reference to FIGS. 1A to 15C.

First Working Example

A first working example of the semiconductor element mounting method according to the first embodiment of the present invention is described with reference to FIG. 1A through FIG. 3B.

Referring to FIG. 1A, wafer size was 5 in., wafer thickness was 0.4 mm, a number of semiconductor elements in a wafer was 78 pieces, a number of pad electrodes within a semiconductor element was 256 pieces, a minimum pitch was 100 µm, and a total number of pads was 19,968.

This wafer 1 was sucked onto an equipment stage, planarized and heated to 250° C. from the stage. Thereafter, stud bumps 3 were formed on the pad electrodes, respectively, of the wafer 1 with use of a 25 µm diameter Au wire (made by Mitsubishi Materials Corp.) via a capillary attached to a wire bonding apparatus. Otherwise, bumps may be formed by plating on individual pads of the wafer 1 as the case may be.

Meanwhile, with a dicing unit applied to interposer 5, 0.15 mm deep, V-shaped grooves were formed.

Referring to FIG. 2A, on the interposer 5 (FR-5; made by NEC Corp.) made of glass epoxy, an insulative resin sheet 6 (MJ-932NP; made by Sony Chemicals Corp.) composed mainly of epoxy resin having a thickness of 60 µm was placed at a semiconductor element formation region of the wafer, and an attaching tool containing a cartridge heater was pressed against the insulative resin sheet 6 under conditions of a temperature of 80° C. and a load of about 14.7 MPa (150 kgf/cm²), by which the insulative resin sheet 6 was stuck to the interposer.

Referring to FIG. 2A, electrodes on the interposer 5 and the bumps 3 formed on semiconductor elements 1 are positionally aligned so as to come into contact with each other, and then temporarily compression-bonded by temporary-compression-bonding mounting head 7. This temporary compression-bonding was performed by heating with the temporary-compression-bonding mounting head 7 under conditions of a wafer temperature of 80° C. and a temporary compression-bonding load of about 14.7 MPa (150 kgf/cm²). When the wafer 1 was temporarily compression-bonded under these temporary compression-bonding conditions, a reaction rate (curing rate) of the insulative resin sheet 6 was 10%.

Thereafter, referring to FIG. 2B, against the interposer 5, to which the wafer 1 had been temporarily compression-bonded, a rear surface of the wafer was pressed with a final compression-bonding load of about 44.1 MPa (450 kgf/cm²) and heated to 200° C., by which the wafer 1 was finally compression-bonded. During this process, the bumps 3 on the wafer 1 and the electrodes on the interposer 5 were electrically connected to each other.

FIG. 3A shows a flow of insulative resin 106 during compression-bonding under a condition that the grooves are not provided in interposer 105. The insulative resin 106 of a central portion of wafer 101 did not flow out, while the insulative resin 106 of its peripheral portions flowed with higher mobility. As a result, bumps 103 of the central portion of the wafer 101 showed higher values of connection resistance with electrodes of the interposer 105 than those of the peripheral portions of the wafer 101, or showed openness of connection. On the other hand, in FIG. 3B, which corresponds to this first working example, in a central portion and peripheral portions of the wafer 1, flow of insulative resin 6 in the central portion and peripheral portions of the wafer became uniform by virtue of presence of the grooves 2 provided in the interposer 5, so that a stable electrical connection was able to be obtained at each of the central portion and the peripheral portions of the wafer 1.

Furthermore, although grooves 2A were provided in the interposer 5 in this case, similar effects can be produced also when grooves 2, 2A are provided in the wafer 1 side or in both the interposer 5 and the wafer 1.

Second Working Example

A second working example of the semiconductor element mounting method according to the second embodiment of the present invention is described with reference to FIGS. 4A, 4B, and 4C.

FIG. 4A shows a flow of insulative resin during compression-bonding in a case where grooves are provided on a wafer side.

Referring to FIG. 4A, similar effects were able to be produced also when grooves 2A were provided on a wafer 1 side, and a uniform flow of insulative resin during compression-bonding was able to be obtained. As a result, a stable electrical connection was able to be obtained at each of a central portion and peripheral portion of the wafer.

Effects of further working examples are shown in FIGS. 4B and 4C.

Referring to FIG. 4B, wafer size was 5 in., wafer thickness was 0.4 mm, a number of semiconductor elements in a wafer was 78 pieces, a number of pad electrodes within a semiconductor element was 256 pieces, a minimum pitch was 100 µm, and a total number of pads was 19,968. With a dicing unit applied to peripheral portions of a semiconductor element formation region within the wafer, 0.15 mm deep, V-shaped grooves were formed.

Referring to FIG. 4C, this wafer 1 was sucked onto a first equipment stage 8 by suction via through holes 13, then planarized, and heated to 250° C. from the stage. Thereafter, stud bumps 3 were formed from a 25 µm diameter Au wire (made by Mitsubishi Materials Corp.) via a capillary 4 attached to a wire bonding apparatus.

Generally, the wafer has semiconductor elements formed on only one-side surface thereof, thus incurring a warp. Because of this warp, stud bumps cannot be formed uniformly and stably on the wafer during the stud bump formation process. In contrast to this, with the grooves formed in the wafer, a stress generated due to formation of the semiconductor elements on only one-side surface of the wafer is released by groove portions, thereby allowing the wafer to be planarized. Thus, the stud bumps were able to be formed stably.

Third Working Example

A third working example of the semiconductor element mounting method according to the third embodiment of the present invention is described with reference to FIG. 5.

FIG. 5 shows a stud bump formation process.

Wafer size was 5 in., wafer thickness was 0.4 mm, a number of semiconductor elements in a wafer was 78 pieces, a number of pad electrodes within a semiconductor element was 256 pieces, a minimum pitch was 100 µm, and a total number of pads was 19,968. For formation of stud bumps on wafer 1, a peripheral portion of the wafer was sucked and fixed by a first stage 11, and the wafer 1 was heated by a cartridge heater 8 contained in a second stage 12. During this process, a temperature of the second stage 12 was 250° C.

Further, the second stage 12 was moved to just under a first semiconductor element formation region within the wafer where stud bumps 3 were to be formed. Then, for formation of bumps of a second semiconductor element formation region, the second stage 12 was moved to the second semiconductor element formation region.

By performing this method, there was a small heat-history difference between bump formation at a first semiconductor element formation region and bump formation at a last semiconductor element formation region, so that a stable strength in terms of bump bonding was able to be maintained.

Fourth Working Example

A fourth working example of the semiconductor element mounting method according to the fourth embodiment of the present invention is described with reference to FIGS. 6A to 8B.

FIGS. 6A–6C show a stud bump formation process. Wafer size was 5 in., wafer thickness was 0.4 mm, an amount of semiconductor elements in a wafer was 78 pieces, an amount of pad electrodes within a semiconductor element was 256 pieces, a minimum pitch was 100 µm, and a total number of pads was 19,968.

After this wafer 1 was sucked onto an equipment stage, planarized and heated to 250° C. from the stage, stud bumps were formed from of a 25 µm diameter Au wire (made by Mitsubishi Materials Corp.) via a capillary 4 attached to a wire bonding apparatus.

Otherwise, bumps may be formed by plating pads of the wafer as the case may be.

Referring to FIGS. 7A–7C, thermosetting insulative resin paste 15 was dripped onto the wafer 1 on which the bumps had been formed, and an insulative resin layer was formed on the wafer by operating a spin coater. The insulative resin layer was then cured by heating at 150° C. for 30 minutes.

Referring to FIG. 8A, electrodes on interposer 5 and bumps 3 formed on the wafer 1 were positionally aligned so as to be brought into contact with each other, respectively, and temporarily compression-bonded by utilizing a temporary-compression-bonding mounting head. This temporary compression-bonding was performed by heating with a temporary-compression-bonding mounting head under conditions of a temperature of 80° C. of the wafer 1 and a temporary compression-bonding load of about 14.7 MPa (150 kgf/cm$^2$). When the wafer 1 was temporarily compression-bonded under these conditions, a reaction rate (curing rate) of the insulative resin layer was in 10%.

Thereafter, with the interposer 5 to which the wafer 1 had been temporarily compression-bonded, a rear surface of the wafer 1 was pressed at a final compression-bonding load of 44.1 MPa (450 kgf/cm$^2$) and heated to 200° C., by which final compression-bonding was accomplished. During this process, the bumps 3 on the wafer 1 and the electrodes on the interposer 5 were electrically connected to each other.

Referring to FIG. 8B, the wafer 1 was divided into individual chips on a semiconductor device basis by utilizing a dicing unit.

With this method, with respect to an issue that electrodes of semiconductor elements, such as Al, would be exposed during performance of stud bump formation on the semiconductor elements, which might cause corrosion of these electrodes due to moisture absorption after assembling of the semiconductor device, exposure of the electrodes on the semiconductor elements was able to be prevented by virtue of an arrangement that the insulative resin layer was formed on the wafer 1 after formation of the stud bumps on the electrodes of the wafer 1 from Au wire.

In this case, the insulative resin layer on the wafer 1 was allowed to be either completely cured or semi-cured, wherein complete curing enhanced protection of electrode exposure portions of the semiconductor elements, while semi-curing enhanced adhesion to the insulative sealing resin during a later semiconductor-element mounting process, so that the semiconductor device itself was able to be improved in terms of reliability grade.

Fifth Working Example

A fifth working example of the semiconductor element mounting method according to the fifth embodiment of the present invention is described with reference to FIGS. 9A–10B.

FIG. 9A shows a stud bump formation process. Wafer size was 5 in., wafer thickness was 0.4 mm, an amount of semiconductor elements in a wafer was 78 pieces, an amount of pad electrodes within a semiconductor element was 256 pieces, a minimum pitch was 100 μm, and a total number of pads was 19,968. By performing screen printing of one-side surface of this wafer 1, opposite to its semiconductor-element side surface, ink 28 was printed for marking and heat-treated.

Thereafter, semiconductor devices 26 shown in FIG. 9C were produced by the same method as described above.

FIGS. 10A and 10B show a method of wafer alignment during ink printing. In marking at a wafer level, positional relationship between a semiconductor-element surface and its opposite surface is unknown. In this case, through holes could be provided in the semiconductor elements by etching or the like to show a positional relationship between front and rear surfaces, but this would cause an increase in cost. In this fifth working example, with use of an orientation flat provided in the wafer as a reference, positional alignment was performed before bump formation was performed on the wafer. Then, simultaneous marking on a semiconductor element basis was performed on a surface of the wafer opposite to its semiconductor element formation surface, so that this simultaneous marking was able to be implemented at a low price and high efficiency.

Sixth Working Example

A sixth working example of the semiconductor element mounting method according to the sixth embodiment of the present invention is described with reference to FIGS. 11A–12B.

FIG. 11A shows a stud bump formation process. Wafer size was 5 in., wafer thickness was 0.4 mm, an amount of semiconductor elements in a wafer was 78 pieces, an amount of pad electrodes within a semiconductor element was 256 pieces, a minimum pitch was 100 μm, and a total number of pads was 19,968.

This wafer 1 was sucked onto a first equipment stage 8, planarized and heated to 250° C. from the stage. Thereafter, stud bumps 3 were formed from a 25 μm diameter Au wire (made by Mitsubishi Materials Corp.) via a capillary 4 attached to a wire bonding apparatus. Otherwise, bumps may be formed by plating pads of the wafer as the case may be.

Referring to FIGS. 11B and 11C, on the wafer on which the stud bumps had been formed, an insulative resin sheet (MJ-932NP; made by Sony Chemicals Corp.) composed mainly of epoxy resin having a thickness of 60 μm was placed at a semiconductor element formation region, and a attaching tool containing a cartridge heater was pressed, thereby stuck, under conditions of a temperature of 80° C. and a load of about 14.7 MPa (150 kgf/cm$^2$).

Referring to FIG. 12A, the wafer 1, in which the stud bumps 3 had been formed and to which the insulative resin sheet 6 had been stuck, was cut into chips on a basis of each semiconductor element by utilizing a scriber unit.

Referring to FIG. 12B, electrodes on interposer 5 and semiconductor element chips were positionally aligned until the bumps 3 came into contact with the electrodes, and temporary compression-bonding was performed by utilizing a temporary-compression-bonding mounting head. This temporary compression-bonding was performed by heating with the temporary-compression-bonding mounting head under conditions of a temperature of 80° C. of the wafer 1 and a temporary compression-bonding load of about 0.637 MPa (6.5 kgf/cm$^2$). When the wafer was temporarily compression-bonded under these temporary compression-bonding conditions, a reaction rate (curing rate) of the insulative resin sheet was 10%.

Thereafter, against the interposer 5, to which the wafer 1 had been temporarily compression-bonded, a rear surface of the wafer was pressed with a final compression-bonding load of about 2.45 MPa (25 kgf/cm$^2$), and heated to 200° C., by which the wafer was finally compression-bonded. During this process, the bumps 3 on the wafer 1 and the electrodes on the interposer 5 were electrically connected to each other.

During an ACF process, which includes attaching an ACF to an interposer and thereafter mounting semiconductor elements, supply of insulative sealing resin for semiconductor elements is performed on a basis of each semiconductor element chip, which would result in lower productivity. Moreover, attaching the ACF arbitrarily to a specified place of the interposer poses a complexity for mass-production equipment. Furthermore, in a case where a plurality of semiconductor elements are mounted on one interposer, a plurality of sizes of ACFs need to be prepared in terms of process, which would lead to an increase in cost as well as a complexity for mass-production control.

By this sixth working example, which includes: a bump formation step for forming bumps on electrodes, respectively, of a wafer on which semiconductor elements have been formed; a step for attaching a sheet-shaped insulative resin layer onto the wafer and subjecting it to pressurization and heating to form an insulative resin layer; a step for cutting the wafer into individual semiconductor elements; and a step for thereafter, positionally aligning the bumps of the semiconductor elements and the electrodes of the interposer with each other, and after heating and pressing, mounting the semiconductor elements, a plurality of semiconductor elements were able to be mounted easily on one interposer 5.

Seventh Working Example

A seventh working example of the semiconductor element mounting method according to a seventh embodiment of the present invention is described with reference to FIGS. 13A–14B.

Referring to FIG. 13A, on an interposer 5 (FR-5; made by NEC Corp.) made of glass epoxy, an insulative resin sheet 6-1 (MJ-932NP; made by Sony Chemicals Corp.) composed mainly of epoxy resin having a thickness of 60 μm was placed at a semiconductor element formation region, and the insulative resin sheet was pressed by a attaching tool containing a cartridge heater under conditions of a temperature of 80° C. and a load of about 14.7 MPa (150 kgf/cm$^2$), by which the insulative resin sheet was stuck to the interposer.

Referring to FIG. 13B, electrodes on the interposer 5 and bumps 3 formed on wafer 1 were positionally aligned so as to be brought into contact with each other, and then temporarily compression-bonded by use of a temporary-compression-bonding mounting head. This temporary compression-bonding was performed by heating with the temporary-compression-bonding mounting head under conditions of a temperature of 80° C. of the wafer 1 and a temporary compression-bonding load of about 14.7 MPa (150 kgf/cm$^2$). When the wafer was temporarily compression-bonded under these temporary compression-bonding conditions, a reaction rate (curing rate) of the insulative resin sheet was 10%.

Thereafter, with the interposer 5, to which the wafer 1 had been temporarily compression-bonded, a rear surface of the wafer was pressed with a final compression-bonding load of about 44.1 MPa (450 kgf/cm$^2$) and heated to 200° C., by which the wafer 1 was finally compression-bonded.

Referring to FIG. 13C, electrodes previously formed on first semiconductor elements and bumps 3 formed on second semiconductor elements 1A were positionally aligned so as to be brought into contact with each other, and then temporarily compression-bonded by using a temporary-compression-bonding mounting head. It is noted that bumps were disposed at coincident positions between the first semiconductor elements and the second semiconductor elements. This temporary compression-bonding was performed by heating with the temporary-compression-bonding mounting head under conditions of a wafer temperature of 80° C. and a temporary compression-bonding load of about 14.7 MPa (150 kgf/cm$^2$). When the wafer was temporarily compression-bonded under these temporary compression-bonding conditions, a reaction rate (curing rate) of the insulative resin sheet was 10%.

Thereafter, against the interposer 5, to which the wafer 1 had been temporarily compression-bonded, a rear surface of the wafer was pressed with a final compression-bonding load of about 44.1 MPa (450 kgf/cm$^2$) and heated to 200° C., by which the wafer 1 was finally compression-bonded. During this process, the bumps 3 on the wafer 1 and the electrodes of the interposer were electrically connected to each other.

Moreover, similar connection resistance was able to be obtained also by bonding both the first semiconductor elements and the second semiconductor elements simultaneously by performing heating and pressurization.

At a wafer level, with regard to a semiconductor device formed by stacking a plurality of semiconductor elements, an issue, that using as a stacking technique an ACF or other pressure-bonding technique involving pressurization and heating would involve insufficient electrical bonding between upper-layer and lower-layer wafers due to bending of a lower-layer side wafer during pressurization, was able to be solved.

Eighth Working Example

An eighth working example of the semiconductor element mounting method according to an eighth embodiment of the present invention is described with reference to FIGS. 14A–15C.

Referring to FIG. 14A, on an interposer 5 (FR-5; made by NEC Corp.) made of glass epoxy, an insulative resin sheet 6C (MJ-932NP; made by Sony Chemicals Corp.) composed mainly of epoxy resin having a thickness of 60 μm was placed at a semiconductor element formation region, and the insulative resin sheet was stuck to the interposer by pressing thereagainst via an attaching tool containing a cartridge heater under conditions of a temperature of 80° C. and a load of about 14.7 MPa (150 kgf/cm$^2$).

Referring to FIG. 14B, electrodes on the interposer and bumps 3 formed on a wafer were positionally aligned so as to be brought into contact with each other, and then temporarily compression-bonded by using a temporary-compression-bonding mounting head. This temporary compression-bonding was performed by heating with the temporary-compression-bonding mounting head under conditions of a temperature of 80° C. of the wafer and a temporary compression-bonding load of about 14.7 MPa (150 kgf/cm$^2$). When the wafer was temporarily compression-bonded under these temporary compression-bonding conditions, a reaction rate (curing rate) of the insulative resin sheet was 10%.

Thereafter, against the interposer 5, to which the wafer had been temporarily compression-bonded, a rear surface of the wafer was pressed with a final compression-bonding load of about 44.1 MPa (450 kgf/cm$^2$) and heated to 200° C., by which the wafer was finally compression-bonded.

Figure 15B:
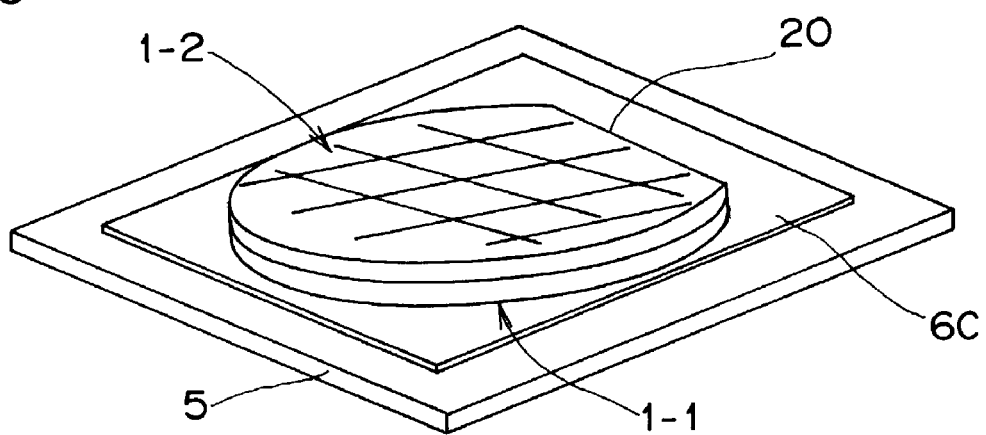
Figure 15C:
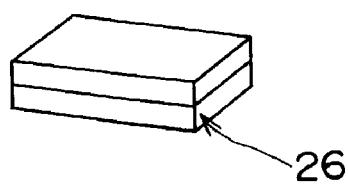

Referring to FIGS. 15A and 15B, electrodes previously formed on first semiconductor elements and bumps formed on second semiconductor elements were positionally aligned with each other so as to be brought into contact with each other, and then a mounting process was performed by a mounting head. During this process, orientation flats were set coincident with each other for bonding so that crystal planes of the first wafer and the second wafer would be aligned with each other. This temporary compression-bonding was performed by heating with the temporary-compression-bonding mounting head under conditions of a temperature of 80° C. of the wafers and a temporary compression-bonding load of about 14.7 MPa (150 kgf/cm²). When the wafer was temporarily compression-bonded under these temporary compression-bonding conditions, a reaction rate (curing rate) of the insulative resin sheet was 10%.

Thereafter, against the interposer 5, to which the wafers had been temporarily compression-bonded, a rear surface of the wafer was pressed with a final compression-bonding load of about 44.1 MPa (450 kgf/cm²) and heated to 200° C., by which the wafer was finally compression-bonded. During this process, the bumps on the wafer and the electrodes on the interposer 5 were electrically connected to each other. Thereafter, by performing dicing, semiconductor devices 26 shown in FIG. 15C were produced.

Moreover, similar connection resistance was able to be obtained also by bonding both first semiconductor elements and second semiconductor elements simultaneously by performing heating and pressurization.

With regard to a semiconductor device formed by stacking a plurality of semiconductor elements, cutting into individual chips after stacking of wafers might incur defects or cracks of the semiconductor elements due to orientation differences of semiconductor crystal planes between upper and lower layers. However, in this eighth working example, the crystal planes of the first wafer and the second wafer were aligned with each other during wafer stacking, whereby occurrence of defects or cracks during cutting into chips was able to be prevented.

It is noted that combining any ones of the foregoing various embodiments appropriately allows their respective effects to be produced in combination.

According to the present invention, semiconductor devices are manufactured through steps of: at a wafer level, forming bumps on electrodes, respectively, of a wafer; temporarily compression-bonding the wafer and an interposer so that the wafer comes into contact with an insulative resin; curing the insulative resin by performing heating and pressurization, and finally compression-bonding the wafer and the interposer together so that the electrodes on the wafer and electrodes on the interposer are directly bonded together; and thereafter separating this bonded unit in units each of a semiconductor device. Thus, a plurality of semiconductor devices can be manufactured simultaneously at the wafer level, so that productivity can be improved.

More specifically, since bumps of a plurality of semiconductor elements can be compression-bonded to electrodes of the interposer, respectively, in a simultaneous manner, a need for taking into consideration thicknesses of individual semiconductor element chips on a chip basis, which would be involved in mounting the semiconductor elements onto the interposer on the semiconductor element chip basis, is eliminated; that is, it is no longer necessary to take into consideration such variations in thickness among individual semiconductor element chips. Also, since a plurality of semiconductor elements are stuck to the interposer via a resin layer, need for a resist application step, curing step, exposure step, and development step, or plating step, or the like are eliminated. In other words, plating or other process steps that can be performed only in semiconductor factories are no longer necessary, and a semiconductor device in which semiconductor elements are mounted on the interposer as they are sealed by the insulative resin layer can be mounted, as it is, onto a specified circuit board. Thus, any plant having no semiconductor factories is enabled to easily handle the semiconductor devices.

Also, since the bumps of a plurality of semiconductor elements can be compression-bonded and connected to the electrodes of the interposer in a simultaneous manner without leveling, a task of leveling is no longer necessary, while the wafer can be corrected in terms of warp. Furthermore, it is no longer necessary to give consideration to lot-to-lot thickness variations of wafers, so that a plurality of semiconductor devices can be manufactured simultaneously and collectively with high productivity. In summary, in the wafer-level conventional method including steps of forming bumps on electrodes of a wafer, temporarily compression-bonding the wafer and an interposer together in contact with an insulative resin positioned therebetween, curing the insulative resin by performing heating and pressurization so that the wafer and the interposer are finally compression-bonded, thereby making the electrodes on the wafer and the electrodes of the interposer bonded together, and thereafter cutting and separating individual semiconductor devices from one another, when the wafer and the interposer are bonded together by using ACF or other pressure-bonding techniques, there would arise an issue in that there are involved larger amounts of escape of the insulative resin to peripheries of the wafer, while the insulative resin cannot escape at a central portion of the wafer, thus making it difficult to obtain uniform bonding at the wafer level.

On the other hand, in the present invention, in which escape places for the insulative resin of the insulative resin layer during compression-bonding of the wafer and the interposer can be provided by virtue of grooves being provided at outer peripheries of individual semiconductor elements on the wafer or at peripheral portions on the interposer side where the semiconductor elements are to be compression-bonded, it becomes possible to allow the insulative resin to escape into the grooves uniformly at both a central portion and peripheral portions within the wafer, thus making it possible to obtain a uniform bonding of the wafer and the interposer at the wafer level. Also, when the grooves are formed so as to satisfy a condition that V2<V1, where V1 (cm³/mm) is the volume of the grooves provided at outer peripheries of the individual semiconductor elements on the wafer or at peripheral portions on the interposer side where the semiconductor elements are to be compression-bonded, and V2 (cm³/mm) is the insulative-resin overflow volume per unit length around the wafer resulting after compression-bonding of the interposer and the wafer together, it becomes possible to ensure sufficient escape volume for the insulative resin, so that a uniform compression-bonding of the wafer and the interposer at the wafer level can be obtained more reliably.

Furthermore, the present invention can produce the following effects. That is, generally, the wafer has semiconductor elements formed on only one-side surface thereof, thus incurring a warp. Because of this warp, there is a possibility that stud bumps cannot be formed into a stable shape uniformly on the wafer during a stud bump formation process. In contrast to this, with the grooves formed in the wafer in the present invention, a stress generated due to formation of the semiconductor elements on only one-side surface of the wafer can be released by the grooves, thereby allowing the wafer to be planarized on a stage, so that stud bumps can be formed in a stable shape. Accordingly, variations in shape can be lessened, and reliability of bonding can be enhanced even further.

Secondly, as formation of the stud bumps at the wafer level involves heating the wafer, there would be a large difference in heat history between bump formation at a first semiconductor element formation region and bump formation at a last semiconductor element formation region. In particular, bumps of semiconductor element formation regions at earlier numbers of order would require a longer heating time, which would promote formation of an alloy layer between a semiconductor element and Au bump. This would lead to an issue, hitherto, of lowered bonding strength of bumps on electrodes of semiconductor elements.

By contrast, according to the present invention, the heating of the wafer for bump formation is performed on the basis of each semiconductor element formation region where the bumps are to be formed, wherein when the bump formation at a semiconductor element formation region under heating is terminated, another semiconductor element formation region where bump formation is next to be performed is heated. Like this, a bump formation operation and heating operation are synchronized with each other so as to be effected for the same semiconductor element formation region, by which at least the bump formation region alone is heated. In this case, heating time becomes constant and short, which allows alloy layer formation to be reduced and less varied, hence stabler quality and stabler reliability of bonding can be realized.

Third, with regard to an issue that, during stud bump formation on a semiconductor element, there is a possibility that electrodes of semiconductor elements, such as Al, would be exposed, which might cause corrosion of semiconductor-element electrodes due to moisture absorption after assembling of a semiconductor device, it becomes implementable to prevent exposure of the electrodes on the semiconductor elements with an arrangement that an insulative resin layer is disposed on a wafer after formation of stud bumps on electrodes of the wafer. A method for forming the insulative resin layer in this case may be spin coating with paste, attaching a sheet, or the like, whichever allows the aforementioned effect to be obtained. In this case, the insulative resin layer on the wafer may be either completely cured or semi-cured, wherein complete curing enhances protection of electrode exposure portions of semiconductor elements, while semi-curing enhances adhesion to the insulative sealing resin during a later semiconductor-element mounting process, so that the semiconductor device itself can be improved in terms of reliability grade.

Fourth, at present, since marking of a first pin or the like is applied to one surface of a semiconductor element opposite to its semiconductor-element surface for each chip of semiconductor devices, there is an issue in terms of productivity. Fifth, during the marking at a wafer level, a positional relationship between a semiconductor-element surface and the semiconductor-element opposing surface is unclear. In this regard, though a through hole may be provided in the semiconductor elements during etching or another process to show a front-and-rear surface positional-relationship, this would cause an increase in cost.

In the present invention, with use of an orientation flat provided in a wafer, positional alignment is performed with the orientation flat used as a stopper reference before bump formation is performed on the wafer, and then simultaneous marking on a semiconductor element basis is performed on a surface of the wafer opposite to a semiconductor element formation surface. In this case, the simultaneous marking can be implemented at low price and high efficiency.

Sixth, in an ACF process, which includes attaching an ACF to an interposer and thereafter mounting semiconductor elements, supply of insulative sealing resin for semiconductor elements is performed on a basis of each semiconductor element chip, which would result in lower productivity. Moreover, attaching the ACF arbitrarily to a specified place of the interposer poses a complexity for mass-production equipment. Furthermore, in a case where a plurality of semiconductor elements are mounted on one interposer, a plurality of sizes of ACFs need to be prepared in terms of process, which would lead to an increase in cost as well as a complexity in mass-production control.

In the present invention, semiconductor elements are mounted onto an interposer through steps of: forming bumps on electrodes, respectively, of a wafer on which semiconductor elements have been formed; attaching and forming a sheet-shaped insulative resin layer on the wafer by performing pressurization and heating; cutting the wafer into individual semiconductor elements; and thereafter, positionally aligning bumps of the semiconductor elements and electrodes on the interposer with each other, followed by performing heating and pressurization; that is, the insulative sealing resin is supplied not on a semiconductor element basis but simultaneously to a multiplicity of semiconductor elements in a wafer state. In this case, productivity is enhanced, and moreover, since the insulative resin layer has been formed on the semiconductor elements before mounting, it is necessary neither to stick an ACF arbitrarily to a specified place of the interposer, nor to prepare a plurality of sizes of ACFs. Thus, multi-chip modules can easily be manufactured. Furthermore, the insulative resin may be thermosetting resin or insulative thermoplastic resin, and particularly in a case of an insulative thermosetting resin, the insulative thermosetting resin may be uncured or semi-cured during formation of the insulative resin.

Seventh, in a semiconductor device made up by stacking a plurality of semiconductor elements, at a wafer level, using as a stacking technique an ACF or other pressure-bonding technique involving pressurization and heating would cause a lower-side wafer to be bent during the pressurization, which would result in insufficient electrical bonding between a lower-layer wafer and an upper-layer wafer.

By contrast, according to the present invention, during wafer-level manufacture of semiconductor devices each of which is formed by stacking on one interposer a plurality of wafers, i.e. a plurality of semiconductor elements, bonding between a first wafer and the interposer and bonding between the first wafer and a second wafer are fulfilled independently of each other by directly connecting their electrodes and bumps to each other, respectively. In this case, when the first wafer and the second wafer are bonded together after bonding of the first wafer and the interposer, sufficient bonding of the first wafer and the second wafer can be achieved even if the first wafer is bent.

Eighth, in a semiconductor device produced by stacking a plurality of semiconductor elements, cutting a wafer into chips after this wafer stacking might incur defects or cracks of the semiconductor elements due to orientation differences in semiconductor crystal planes between upper and lower layers.

By contrast, according to the present invention, in which wafer crystal planes of a first wafer and second wafer are aligned with each other during wafer stacking, by aligning orientation flats with each other, occurrence of defects or cracks during cutting into chips can be prevented.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method comprising:
performing wire bonding and thereby forming stud bumps on electrodes of semiconductor elements of a wafer;
temporarily compression-bonding said semiconductor elements and an interposer, by applying a first pressure and heat at a first temperature, such that said semiconductor elements and said interposer are brought into contact with an insulative resin sheet positioned therebetween; and
curing insulative resin of said insulative resin sheet by applying a second pressure and heat at a second temperature, with said second pressure being greater than said first pressure and said second temperature being greater than said first temperature, whereby said wafer and said interposer are finally compression-bonded to each other such that individual ones of said electrodes and individual electrodes of said interposer become bonded to each other, respectively, so as to form a bonded unit; and
dicing said bonded unit such that said bonded unit is cut and separated into individual chips for semiconductor devices, with each of said chips including one of said semiconductor elements,
wherein grooves are provided in at least one of said wafer and said interposer coincident with lines along which said bonded unit is diced, and
wherein applying said second pressure and heat at said second temperature results in some of said insulative resin flowing in said grooves so as to provide a uniform flow of said insulative resin.

2. The method according to claim 1, further comprising:
while forming said stud bumps, heating each region of said wafer at which one of said semiconductor elements is located.

3. The method according to claim 2, further comprising:
sucking and holding said wafer via a first stage,
wherein heating each region of said wafer at which one of said semiconductor elements is located comprises sucking, holding and heating a side of said each region via a second stage, with said side of said each region being opposite a side of said each region on which is located said one of said semiconductor elements.

4. The method according to claim 3, further comprising:
while sucking, holding and heating said side of said each region via said second stage, moving said second stage in synchronization with said each region.

5. The method according to claim 1, further comprising:
while applying said second pressure and heat at said second temperature, heating each region of said wafer at which one of said semiconductor elements is located.

6. The method according to claim 1, further comprising:
providing said insulative resin sheet on said wafer after forming said stud bumps.

7. The method according to claim 1, further comprising:
prior to forming said stud bumps, simultaneously forming markings on a surface of said wafer that is opposite to a surface thereof on which said semiconductor elements are provided, with each of said markings corresponding to a respective one of said semiconductor elements.

8. The method according to claim 7, further comprising:
prior to simultaneously forming said markings, positional aligning said wafer by using an orientation flat of said wafer as a stopper reference.

9. A method comprising:
performing wire bonding and thereby forming stud bumps on electrodes of semiconductor elements of a wafer;
temporarily compression-bonding said semiconductor elements and an interposer, by applying a first pressure and heat at a first temperature, such that said semiconductor elements and said interposer are brought into contact with an insulative resin sheet positioned therebetween;
curing insulative resin of said insulative resin sheet by applying a second pressure and heat at a second temperature, with said second pressure being greater than said first pressure and said second temperature being greater than said first temperature, whereby said wafer and said interposer are finally compression-bonded to each other such that individual ones of said electrodes and individual electrodes of said interposer become bonded to each other, respectively;
compression-bonding another wafer onto said wafer via another insulative resin in a stacked manner such that said bumps of said wafer are in alignment with bumps of said another wafer;
bonding said electrodes of said wafer to said bumps of said another wafer through said another insulative resin so as to form a bonded unit including said another wafer, said another insulative resin, said wafer, said insulative resin and said interposer; and
dicing said bonded unit such that said bonded unit is cut and separated into individual chips for semiconductor devices, with each of said chips including one of said semiconductor elements.

10. The method according to claim 9, further comprising:
prior to compression-bonding said another wafer onto said wafer, aligning a crystal direction of said wafer with a crystal direction of said another wafer.

11. A method comprising:
performing wire bonding and thereby forming stud bumps on electrodes of semiconductor elements of a wafer;
temporarily compression-bonding said semiconductor elements and an interposer, by applying a first pressure and heat at a first temperature, such that said semiconductor elements and said interposer are brought into contact with an insulative resin sheet positioned therebetween;
curing insulative resin of said insulative resin sheet by applying a second pressure and heat at a second temperature, with said second pressure being greater than said first pressure and said second temperature being greater than said first temperature, whereby said wafer and said interposer are finally compression-bonded to each other such that individual ones of said electrodes and individual electrodes of said interposer become bonded to each other, respectively, so as to form a bonded unit; and
dicing said bonded unit such that said bonded unit is cut and separated into individual chips for semiconductor devices, with each of said chips including one of said semiconductor elements,
wherein grooves are provided in at least one of said wafer and interposer coincident with lines along which said bonded unit is diced such that applying said second pressure and heat at said second temperature results in some of said insulative resin flowing in said grooves and overflowing from between said wafer and said interposer so as to provide a uniform flow of said insulative resin, with each of said grooves having a volume V1 at least equal to a volume V2 per unit length of resin that has overflowed at peripheral portions of said wafer.

12. A method comprising:

forming stud bumps on electrodes of semiconductor elements of a wafer;

temporarily compression-bonding said semiconductor elements and an interposer, by applying a first pressure and heat at a first temperature, such that said semiconductor elements and said interposer are brought into contact with an insulative resin layer positioned therebetween;

curing insulative resin of said insulative resin layer by applying a second pressure and heat at a second temperature, with said second pressure being greater than said first pressure and said second temperature being greater than said first temperature, whereby said wafer and said interposer are finally compression-bonded to each other such that individual ones of said electrodes and individual electrodes of said interposer become bonded to each other, respectively, so as to form a bonded unit; and dicing said bonded unit along lines such that said bonded unit is cut and separated into individual chips for semiconductor devices, with each of said chips including one of said semiconductor elements, wherein grooves are provided in at least one of said wafer and interposer coincident with said lines along which said bonded unit is diced such that applying said second pressure and heat at said second temperature results in some of said insulative resin flowing in said grooves so as to provide a uniform flow of said insulative resin.

13. The method according to claim 12, wherein forming stud bumps on electrodes of semiconductor element formation regions of a wafer comprises forming said stud bumps by performing wire bonding.

14. The method according to claim 13, further comprising:

providing said insulative resin layer on said wafer, after forming said stud bumps, by spin coating a resin paste onto said wafer and curing said resin paste.

15. The method according to claim 13, further comprising:

providing said insulative resin layer on said wafer, after forming said stud bumps, by spin coating a resin paste onto said wafer and semi-curing said resin paste.

16. The method according to claim 13, further comprising:

providing said insulative resin layer on said wafer, after forming said stud bumps, by attaching an insulating film onto said wafer and then heating and pressing said insulative film.

* * * * *